(12) United States Patent
Tsai et al.

(10) Patent No.: US 12,360,049 B2
(45) Date of Patent: Jul. 15, 2025

(54) SURFACE ANALYSIS OF GEMSTONES

(71) Applicant: Gemological Institute of America, Inc., Carlsbad, CA (US)

(72) Inventors: Tsung-Han Tsai, Maywood, NJ (US); Hiroshi Takahashi, Fort Lee, NJ (US); Joey McEnery, New York, NY (US)

(73) Assignee: Gemological Institute of America, Inc., Carlsbad, CA (US)

( * ) Notice: Subject to any disclaimer, the term of this patent is extended or adjusted under 35 U.S.C. 154(b) by 81 days.

(21) Appl. No.: 18/096,553

(22) Filed: Jan. 12, 2023

(65) Prior Publication Data

US 2023/0228690 A1    Jul. 20, 2023

Related U.S. Application Data

(60) Provisional application No. 63/300,630, filed on Jan. 18, 2022.

(51) Int. Cl.
*G01N 21/87* (2006.01)
*G01N 21/88* (2006.01)

(52) U.S. Cl.
CPC ......... *G01N 21/87* (2013.01); *G01N 21/8851* (2013.01); *G01N 2021/8864* (2013.01); *G01N 2021/8887* (2013.01)

(58) Field of Classification Search
CPC ............... G01N 21/8851; G01N 21/87; G01N 2021/8864; G01N 2021/8887
See application file for complete search history.

(56) References Cited

U.S. PATENT DOCUMENTS

| | | | |
|---|---|---|---|
| 4,302,097 A | | 11/1981 | Chlestil |
| 5,430,538 A | * | 7/1995 | Kobayashi ............ G01N 21/87 |
| | | | 356/30 |
| 5,883,388 A | | 3/1999 | Smith et al. |
| 5,966,673 A | * | 10/1999 | Shannon, Sr. ......... G01N 21/87 |
| | | | 356/30 |
| 6,567,156 B1 | | 5/2003 | Kerner |
| 6,870,606 B2 | * | 3/2005 | Klingler ................. G01N 21/87 |
| | | | 356/601 |
| 7,259,839 B2 | | 8/2007 | Sivovolenko |
| 7,411,663 B2 | | 8/2008 | Van et al. |
| 7,436,498 B2 | | 10/2008 | Kerner et al. |
| 7,580,118 B2 | * | 8/2009 | Sasian .................... G01N 21/01 |
| | | | 356/30 |
| 8,098,368 B2 | | 1/2012 | Shlezinger et al. |
| 8,436,986 B2 | | 5/2013 | Hornabrook et al. |
| 8,498,847 B2 | | 7/2013 | Gelman et al. |
| 8,639,479 B2 | * | 1/2014 | Sivovolenko .......... G06T 17/10 |
| | | | 703/2 |
| 9,222,893 B2 | | 12/2015 | Hornabrook et al. |
| 9,292,966 B2 | * | 3/2016 | Sivovolenko ...... G01B 11/2433 |
| 9,322,785 B2 | | 4/2016 | Smith et al. |
| 9,355,124 B2 | | 5/2016 | Horiuchi |

(Continued)

FOREIGN PATENT DOCUMENTS

WO     2023/141054 A1    7/2023

*Primary Examiner* — Gordon J Stock, Jr.
(74) *Attorney, Agent, or Firm* — DLA PIPER LLP US; Blake W. Jackson; Thomas J. Fuller

(57) ABSTRACT

Systems and methods here may be used for capturing and analyzing reflectance images of facets on a gemstone under particular lighting and camera setups to automatically generate a clarity grade and/or surface polish grade for the gemstone.

20 Claims, 19 Drawing Sheets

(56) References Cited

U.S. PATENT DOCUMENTS

| | | |
|---|---|---|
| 9,625,393 B2 | 4/2017 | Smith et al. |
| 9,678,017 B2 | 6/2017 | Lapa et al. |
| 10,489,647 B2 | 11/2019 | Schaefer |
| 10,552,950 B2 * | 2/2020 | Balagurusamy .......... G06T 7/55 |
| 10,692,281 B1 | 6/2020 | Cohen |
| 11,029,252 B2 | 6/2021 | Patel et al. |
| 11,185,138 B2 | 11/2021 | Maltezos et al. |
| 11,326,952 B2 | 5/2022 | Hui et al. |
| 11,673,228 B2 | 6/2023 | Sivovolenko |
| 11,815,465 B2 | 11/2023 | Balagurusamy et al. |
| 11,867,637 B2 * | 1/2024 | Hakim ............. G06K 19/06037 |
| 11,892,412 B2 | 2/2024 | Ioffe et al. |
| 11,893,809 B2 | 2/2024 | Hong |
| 11,915,407 B2 | 2/2024 | Verboven et al. |
| 12,117,403 B2 | 10/2024 | Hong |
| 12,135,202 B2 | 11/2024 | Kerner et al. |
| 2004/0246464 A1 | 12/2004 | Sivovolenko |
| 2006/0066877 A1 | 3/2006 | Benzano |
| 2016/0290930 A1 * | 10/2016 | Takahashi ............ G01N 33/389 |
| 2017/0021530 A1 | 1/2017 | Gaywala et al. |
| 2018/0120236 A1 | 5/2018 | Lu et al. |
| 2020/0049631 A1 | 2/2020 | Patel |
| 2020/0173930 A1 | 6/2020 | Alonie et al. |
| 2021/0033540 A1 | 2/2021 | Hui et al. |
| 2021/0302322 A1 | 9/2021 | Tsai et al. |
| 2023/0243758 A1 * | 8/2023 | Tsai ....................... G01N 21/17 |
| | | 356/490 |
| 2023/0408420 A1 * | 12/2023 | Kerner ................... G01N 21/87 |
| 2024/0102937 A1 * | 3/2024 | Tsai ................... G01N 21/8806 |
| 2024/0255434 A1 * | 8/2024 | Sheps .................. G02B 21/082 |
| 2024/0319107 A1 | 9/2024 | Insalago et al. |

\* cited by examiner

2D Fourier transform Perpendicular to the polish lines, ~40°

Image

Surface graining

SURFACE ANALYSIS OF GEMSTONES

CROSS REFERENCE TO RELATED APPLICATIONS

The application claims priority to U.S. Provisional Application No. 63/300,630 filed on Jan. 18, 2022, the entirety of which is hereby incorporated by reference.

FIELD

The field includes systems and methods for using reflectance imaging to evaluate the surface quality of a gemstone.

BACKGROUND

Gemstone clarity grading and polish grading are greatly influenced by surface features on facets of gemstones. For example, the surface polishing quality and any identifiable surface reaching inclusions would affect the grade and therefore the value of a diamond because surface features may greatly affect the clarity grade of that stone. Another example of surface analysis is in gemstone treatment detection where locating gemstone surface reaching fractures is a step in determining if a stone has been treated (e.g., using a clarity treatment such as laser drilling). Additionally, surface analysis may be used in a determination of whether any artificial clarity enhancements are used on a particular stone.

But currently, these analyses are all accomplished manually by analysists using human eyes and magnifying instruments. This current system of manual analysis leads to inaccurate and inconsistent clarity grading as well as being time consuming.

There exists a need for an automated system that allows for efficient testing of gemstone surface analysis that is both accurate and able to be used in many different circumstances for multiple testing scenarios.

SUMMARY

Systems and methods here may be used for analyzing gemstone surfaces to accurately and consistently grade the clarity and surface polishing of the gemstone using computer imaging and analysis.

Methods and systems described here include analyzing a gemstone using reflectance analysis, the system comprising, a computer with a processor and memory in communication with a camera, a plurality of motors, and a light source, the computer configured to cause the light source to illuminate a gemstone mounted on a rotatable stage, the computer further configured to command the plurality of motors to adjust the camera such that a long focal axis of the camera is aligned with a normal of a target facet of the gemstone, the camera configured to capture an image of the gemstone target facet using the camera and send the captured image to the computer, the computer further configured to cause storage of the captured image and a correlated data set of information from the plurality of motors indicating an azimuth of the stage, slope angle of the camera to a horizontal, and distance of the camera to the gemstone, the computer further configured to receive a first image of the target facet of the gemstone from the camera, detect a feature in the captured image of the target facet of the gemstone, map the feature in the captured image of the target facet of the gemstone, identify the feature in the captured image of the facet of the gemstone, and determine a clarity grade of the gemstone using the mapped and identified feature on all facets (including the target facet) of the gemstone.

Systems and methods here may include embodiments where the determination of the azimuth of the stage, slope angle of the camera to a horizontal, and distance of the camera to the gemstone includes using sensor data from the plurality of motors sent to the computer. Additionally or alternatively in some examples, one of the plurality of motors is a motor configured to turn the stage on which the gemstone sits. And in some examples, one of the plurality of motors is a motor configured to tilt the camera relative to the stage on which the gemstone sits. In some embodiments, the light source and the camera are mounted to aim their respective focuses on the stage at an angle of between 10 and 30 degrees. In some examples, additionally, or alternatively, the light source and the camera are mounted to aim their respective focuses on the stage at an angle of approximately 20 degrees. In some examples, one of the plurality of motors is a motor configured to increase and decrease the distance between the camera and the stage on which the gemstone sits for focusing the camera. Additionally or alternatively, the computer is configured to command the camera to capture an image of the target facet, determine a position of a second facet, command the stage to rotate to bring the second facet into a field of view of the camera to capture a new image of the second facet. In some examples, the feature to be identified and used in the clarity grade include at least one of a blemish, an inclusion, and a polish line.

BRIEF DESCRIPTIONS OF THE DRAWINGS

For a better understanding of the embodiments described in this application, reference should be made to the Detailed Description below, in conjunction with the following drawings in which like reference numerals refer to corresponding parts throughout the figures.

DETAILED DESCRIPTION

Figure 1:
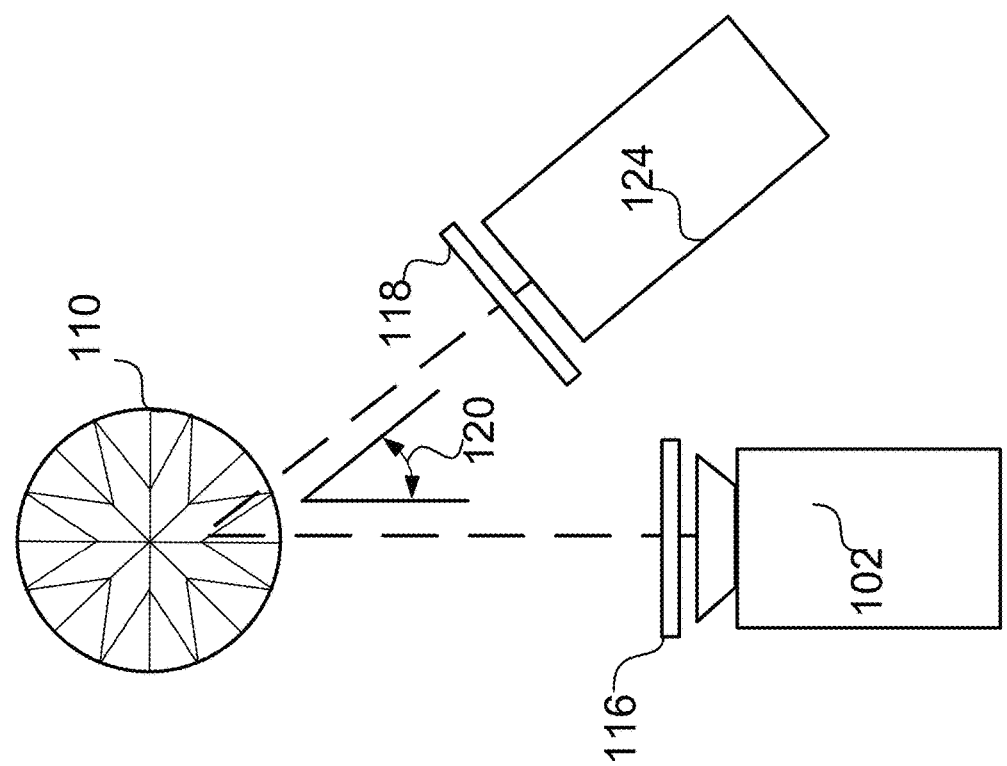
FIG. 1 is an illustration of an example system in accordance with certain aspects described herein.

Reference will now be made in detail to embodiments, examples of which are illustrated in the accompanying drawings. In the following detailed description, numerous specific details are set forth in order to provide a sufficient understanding of the subject matter presented herein. But it will be apparent to one of ordinary skill in the art that the subject matter may be practiced without these specific details. Moreover, the particular embodiments described herein are provided by way of example and should not be used to limit the scope of the particular embodiments. In other instances, well-known data structures, timing protocols, software operations, procedures, and components have not been described in detail so as not to unnecessarily obscure aspects of the embodiments herein.

Overview

Systems and methods here may be used for using reflection imaging to evaluate the surface quality of a gemstone. As the surface feature is an important quality/value factor for a polished gemstone, the surface features may affect a grade of a gemstone polishing and may affect the grade of a gemstone clarity. This is especially the case in a high clarity diamond, where surface features usually dominate its clarity grade.

Another application of surface analysis is in treatment detection. In the market, more than 90% of emeralds are clarity enhanced by filling surface reaching fractures with oil, epoxy, or a mixture of chemicals. Locating surface reaching fractures in an emerald is one useful step for clarity enhancement detection that may be aided by the systems and methods here.

Systems and methods here may be used to capture and evaluate fine surface features, such as surface polishing lines and blemishes images on a gemstone facet automatically with computer image capture and analysis. Such systems and methods include a specially arranged lighting and imaging environment to enhance the surface features on a stone. This arrangement may enable an imaging system to capture fine surface features on digital images for computer analysis.

Some examples include locating and scanning multiple gemstone facets by adjusting camera position in slope angle (θ) and distance (d), and sample's azimuth angle (φ) to allow for images to be in-focus, and in proper contrast to enhance any surface features present. This may allow images to better capture fine lines and surface features. Some examples may include facet localization using a wire diagram or other computer mapping features which may be automated to reduce data collection time by storing information regarding the image capture lighting and camera position.

After image collection the system may be programmed to evaluate captured images for surface quality, classification of surface feature types, mapping any identified features, and quantifying the impact of surface features to create or adjust a gemstone clarity grade. Such analysis may be automated using computer software and image pixel analysis to help or to determine a clarity grade and/or polishing grade.

In some examples, additionally or alternatively, the camera or imaging system magnification may determine the smallest variation that can be detected on the surface of a gemstone, such as but not limited to the roughness on a polished surface. High magnification may be required to image shallow, narrow, fine surface features such as scratches and/or pits, and fine transparent polish lines.

To best capture images of these minute features, a homogeneous excitation light may be used. Such a light source may be laser light as coherent light may include speckle patterns that typically occur in diffuse reflections of monochromatic light such as laser light, and such patterns may hide fine surface features. As such, a collimated incoherent light source may have better angular sensitivity, and allow the imaging system to only reveal surface features under narrow angles. Any of various lights described here and throughout the description may be used with any of the described embodiments alone or in combination.

Surface Reflection Imaging Example Hardware Setup

Systems and methods here may be used to capture images of a gemstone surface features. Specific hardware arrangements of cameras and lights may be used to better reveal polishing features on the gemstone surfaces that might otherwise be hidden or indetectable using digital imaging. FIG. 1 shows an example top down angle of a hardware setup where a digital camera 102 and a light source 124, such as a light emitting diode (LED) light source, are both pointed toward the same position on a sample gemstone 110. In the example, polarizers 116, 118 are placed before the camera 102 lens and the LED 124. The angle 120 between the focal plane of the camera 102 and the LED light source 124 is shown as an example of 20 degrees. In some examples, the angle 120 is between 15 and 25 degrees.

In such examples, the gemstone 110 under analysis may be facing down on a sample stage (not shown in top down view). In some examples, the stage includes a vacuum assembly or port to hold the sample gemstone 110 to the stage for analysis. In some examples, the LED light source 124 is a telecentric LED to increase angular sensitivity of the image and reduce reflection. By pre-aligning the camera 102 and LED 124 to the focal plane of the camera 102, precise images may be captured.

In some examples, an azimuth angle, slope angle on the sample stage and distance on the camera to acquire clear surface images. Some examples utilize two parallel polarizers, one for the camera 116, and one for the light source 118 to help minimize internal reflections.

In some examples, the hardware arrangement of FIG. 1 may include precision gauges in order to aim the camera 102 and light source 124 at the gemstone 110 on the stage. Such gauges may include position sensors adapted to determine radial turn movement around an axis, where such axes are used in the mounting of the camera 102 and/or light source 124. Such axes may be gimbals, motors, fulcrums, or any other kind of pivoting mount. In some examples, motors such as servo motors, stepper motors, or other motors may be used to adjust the aim of the mounted camera 102 and/or light 124 by computer commands. In such examples, manual movement and/or automated movement of camera 102 and/or light source 124 may be used to position the image capture and/or lighting arrangements to obtain the desired effects. In some examples, the stage (not shown in top down view of FIG. 1) may rotate to provide multiple viewing angles of the gemstone 110 to the camera 102.

In some examples, lasers may be used to aim or position the camera 102 and/or light 124 by providing visual feedback with a laser beam pointing in the same direction as the camera.

Figure 2:
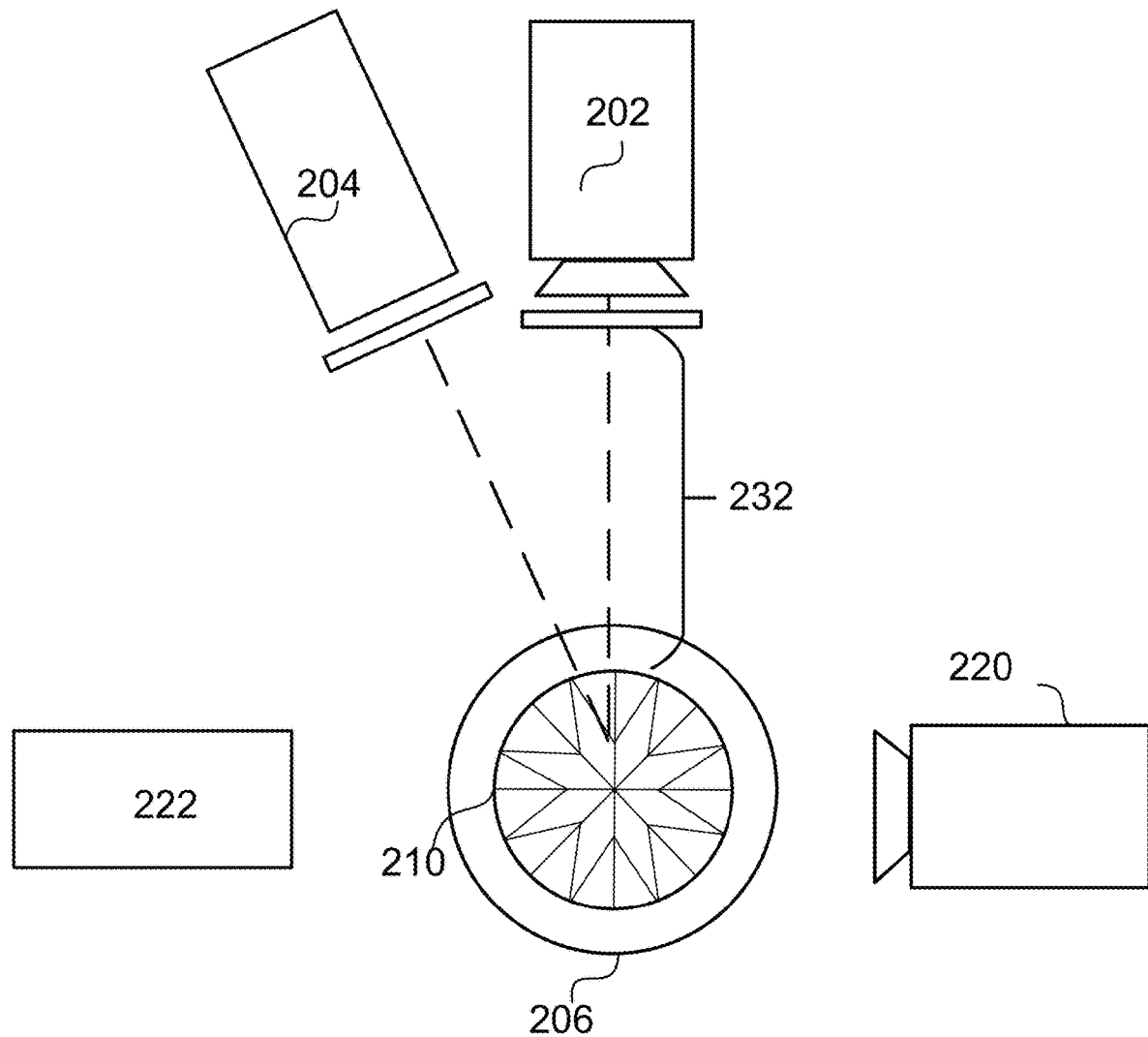
FIG. 2 is another illustration of an example system in accordance with certain aspects described herein.

FIG. 2 shows another example hardware setup from a top down angle. The setup includes a surface imaging digital camera 202 and a light source 204 such as but not limited to an LED light source. The surface imaging camera 202 and light source 204 are both arranged to point at or aim at a stage 206 where a sample gemstone 210 may rest. In some examples, this may mean that the camera 202 and light source 204 are aimed at a center of the stage 206. In some examples, a vacuum assembly may be included with a port on the stage 206 or comprising the stage 206. In such an example, the vacuum pump may be located in one location and a vacuum tube may terminate at the stage 206 and hold samples to the stage, as long as the gemstone 210 under evaluation has a larger diameter than any of the ports or holes on the vacuum stage 206 so it is held to the stage structure, but not ingested into the stage vacuum system. In some examples, a semipermeable mesh or material may be used to allow air to suck through the vacuum ports in the stage but still support the gemstone 210 on the stage.

Wireframe Examples

Facet reflections can be used to create 3D wireframe of gemstones. Although the camera is not perpendicular to the gemstone, the image distortion caused by approximately 10° tilt can be corrected using the below formula:

Width*(1/cos(10°)),~1.54% distorted horizontally

In some examples, a wireframe may be determined using reflectance images instead of or in conjunction with silhouette images. This may be accomplished by computer mapping each facet and creating a model using the dimensions of each facet to create a wireframe model.

In some examples, additionally or alternatively, a wireframe silhouette imaging setup is also utilized. In such a wireframe example, a wireframe silhouette camera 220 is aimed at the stage 206 where a sample gemstone 210 is arranged. Opposite the wireframe silhouette digital camera 220, a light source 222 such as an LED light source is arranged. In such a way, the wireframe silhouette camera may capture images of a silhouette of the sample gemstone 210 using the light source to back light the gemstone 210 from the perspective of the wireframe silhouette camera 220 thereby presenting a silhouette to image. In such an arrangement, a wireframe may be made of a sample gemstone 210 by capturing multiple images while the stage rotates the gemstone 210 in relation to a stationary wireframe camera 220 and the silhouette backlight 222. By rotating the gemstone 210 on the stage 206, the wireframe silhouette camera 220 may capture multiple images of the gemstone 210 silhouette and the computer system may store the silhouette images to create an overall wireframe diagram of the stone 210 using digital image pixel analysis and outline shape detection. The computer may utilize the silhouette images to create a computer model of the gemstone 210 with every facet drawn in the model and every angle and dimension of the wireframe generated. Such a model may be used by the computer to map any features detected by the systems and methods here as described onto the model of the sample gemstone. Such a map may be used to generate or change a clarity model of a gemstone, as described herein.

Figure 3:
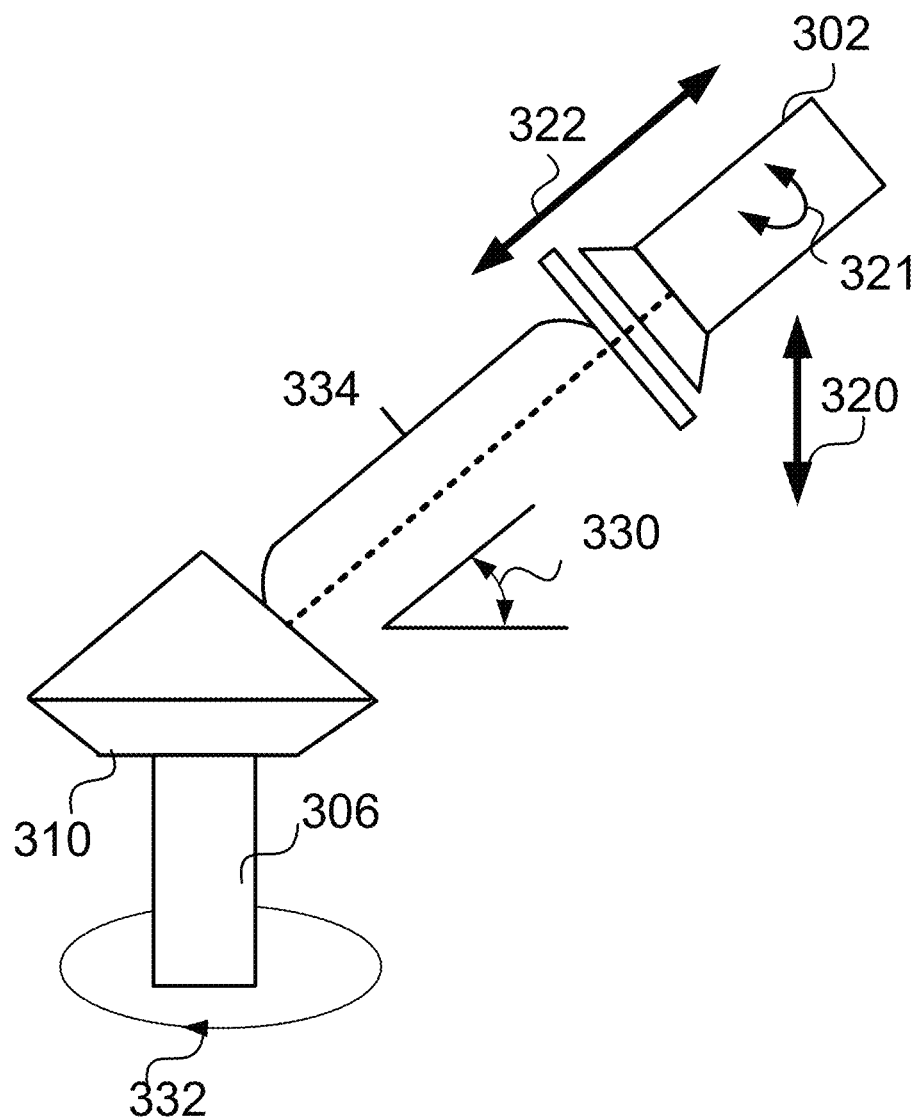
FIG. 3 is another illustration of an example system in accordance with certain aspects described herein.

FIG. 3 is a side view of an example surface imaging camera 302 and gemstone 310 on the stage 306. In the example setup of FIG. 3, the focal plane of the camera 302 is adjusted to be perpendicular or nearly perpendicular to a particular facet angle on the sample stone 310. As described, various motors and hardware structures may be used to adjust the various angles and positions of the camera 302 in relation to the stone 310 to capture multiple images of the gemstone 310. It should be noted that a light source (204 in FIG. 2) in some examples, may move with the camera 302 adjustments as described.

The hardware setups described in FIGS. 1 and 2 showing a top down angle and FIG. 3 showing a side angle may be used to capture images of the sample gemstone (110, 210, and 310). The camera 102, 202, 302 and/or light source 124, 204, 304 may be adjusted in three polar coordinates in order to help enhance and image the gemstone facet surfaces as described.

For example, the slope angle θ 330 in FIG. 3 may be adjusted by moving the camera 302 up and down 320 and/or pivot 321 in relation to the stone 310 to try and obtain an angle perpendicular to the gemstone 310 facet that is being imaged. The next angle is the azimuth angle φ 332 in FIG. 3 adjusted by turning or pivoting the stage 306 about an axis to provide each angle to the camera 302 as it is rotated. Another coordinate variable is a distance d, 334 of the camera 302, to the sample gemstone 310 changed by moving the camera 302 by motors in and out 322 toward and away from the stone 310 as described.

As shown in the example setup of FIG. 3, images showing reflection of each individual facet of a gemstone may be captured and analyzed using this setup. To aid in the analysis of each image, the parameters and/or coordinates of the hardware setup may be acquired, correlated, and stored with the corresponding images for each reflectance facet image. Such information may include but is not limited to camera slope angle θ 330, azimuth angle φ 332 and a distance d, 334 of the camera 302, to the sample gemstone 310. Such information may be taken from sensors on the various motors used to rotate the stage 306, move the camera 302 out and in 322, up and down 320 and/or tilt 321 the camera 302. This information may allow for comparison of hardware setup for various images taken under different light and camera parameters. As described, in some examples, the stage 306 includes a vacuum assembly and ports to hold a sample B10 to the stage 306 during evaluation.

In some examples, additionally or alternatively to using sensor data on the motors, wireframe data may be used to determine the various light and camera parameters. For example, once the wireframe data is determined for a gemstone 310, and a distance 332 between the stone 310 and camera 302 is determined, the wire frame data collected and determined for the individual stone 310 may be used to map all the facet faces and junctions of the gemstone. When rotated in an azimuth 332, so the camera 302 may view the different facets, a computer system may be used to determine the viewing angle of the camera for each reflectance image.

The alignment of the camera 310 may be along the long axis vertical of the camera. In some examples, the accuracy of angular alignment may be between +/−0.6 degrees for both azimuth and slope. In some examples, the accuracy of angular alignment may be between +/−0.5 degrees azimuth for girdle images. In some examples, an adjustment range of slope may be +90 degrees to −75 degrees and the azimuth a full 360 degrees. Additional offsets may be set to each parameter in order to better reveal minute surface features in the reflectance images such as polishing features as described herein.

In such examples, the camera 302 may be mounted to a gimbal or motor arrangement to adjust the slope angle θ 330 of the camera to the gemstone by computerized instruction. The azimuth angle ϕ 332 may be adjusted by a motor turning a stage 306 with the gemstone 310 resting or mounted on it. Software may be used to control all motorized stages, lighting, and camera imaging devices to automatically generate angle and distance parameters from side viewing camera (220 from FIG. 2) or load the information from wireframe data.

In such examples, three motorized stages for slope angle θ 330, azimuth angle #332 and a distance d, 334 of the camera 302 may be adjusted and programmed for movement to allow the system to sequentially capture reflectance images of facet surfaces on the gemstone 310. In such examples, even automated shutter time control may be used to avoid saturation and maximize contrast in the reflectance images.

In some examples, this stage 306 is smaller than the table of the gemstone 310 such that it does not obstruct images taken from crown facets or multiple angles.

The mechanisms to adjust and move the cameras and lights in relation to the sample gemstone may be by servo motors attached to gimbals, rods, supports, braces, and other hardware architecture known in the industry. The stage 306, 206 and/or camera 302, 202 and light 204 may rotate relative to one another. Other various small electric motors may be used such as stepper motors, brushless motors, and brush dc motors to move the camera and light in order to change the slope angle θ, azimuth ϕ and distance, d of the camera to the gemstone as described herein.

Crown Angle

In some examples, it may be advantageous to angle the system to allow the camera a better view of the crown facets. In some examples, a table down setting of a sample gemstone may allow a camera to capture such images of the crown facets as described herein.

Figure 4:
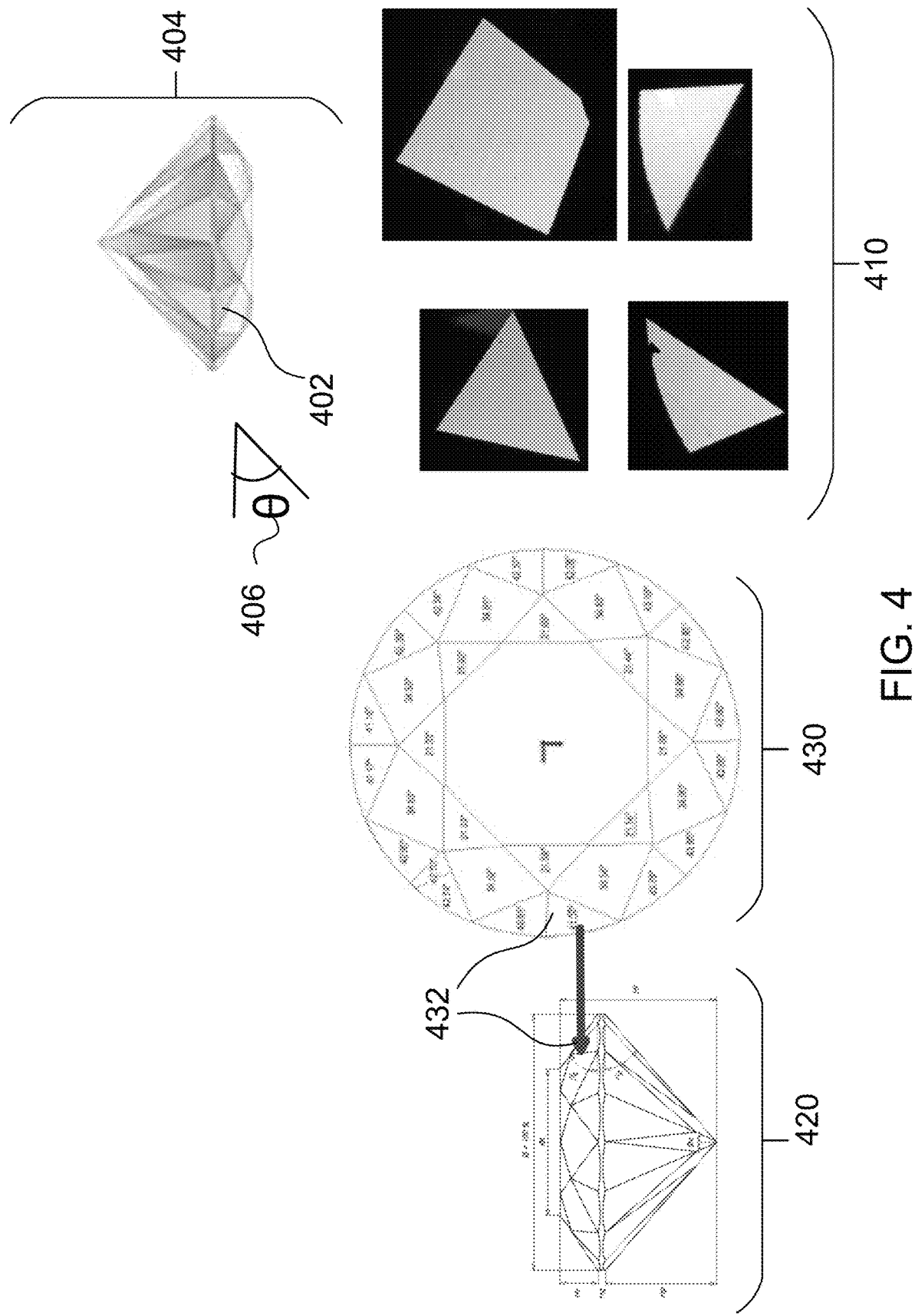
FIG. 4 are illustrations of example mapping in accordance with certain aspects described herein.

FIG. 4 shows an example mapping and image capture of crown facets as described herein. As described, the systems may be arranged to capture images of the crown facets of a sample gemstone. In such a way, the camera angle 402 may be directed toward a gemstone 404 below the girdle and up toward the crown facets, in a table down arrangement. Such an angle θ 406 may be the slope angle to capture different crown facets, for example, those shown in FIG. 4 from the side 420 and top table 430 mapping the same facet 432 on each diagram. For example, the table down angles 406 used to capture the different crown facets may include, but are not limited to the sixteen upper girdle facets at about −48 degrees; the eight bezel facets at about −55 degrees; and eight star facets at about −69 degrees. These camera angles may produce images 410 of the various crown facets for analysis as described herein.

Figure 5:
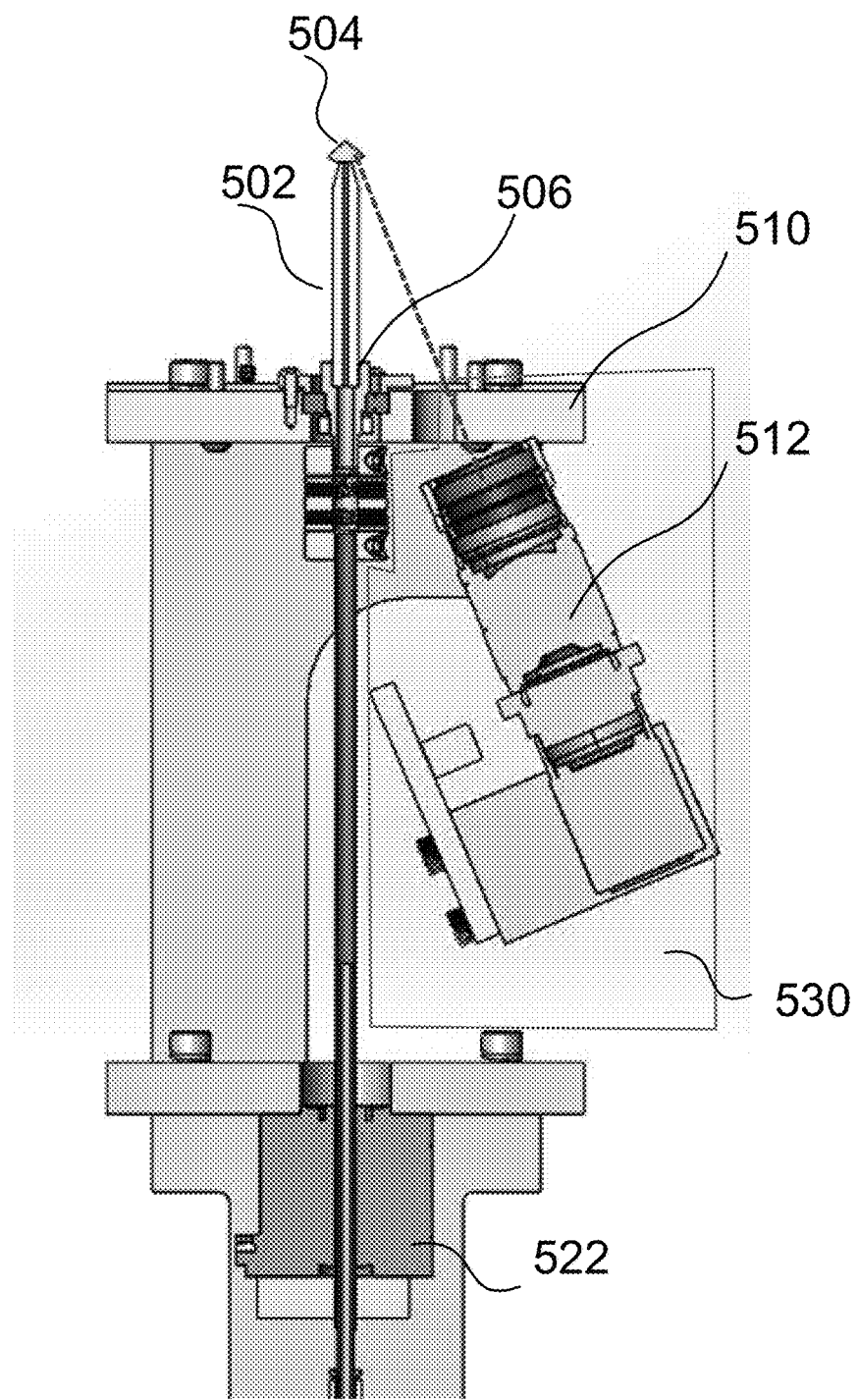
FIG. 5 is another illustration of an example system in accordance with certain aspects described herein.

FIG. 5 shows an example hardware system setup with different camera viewing angles to capture crown facets. In FIG. 5 a stage arrangement 502 is shown holding a sample gemstone 504. In some examples, the stage 502 may include a vacuum assembly to use air pressure to hold the sample gemstone 504 to the stage 502 by the table and secure it for imaging as described. A detail of the stage is shown in FIG. 6.

FIG. 5 also shows an arrangement where a bearing 506 allows a frame 510 that includes the camera 512 to remain still while a motor 522 rotates the stage 502 and thereby the sample gemstone 504. In such an arrangement, the area boxed 530 can be kept clear and the motor 522 is located below the camera arrangement 512. By aiming up, the camera 512 may be tilted so as to capture the table down gemstone 504 held by the stage 502 and capture images of the crown facets while the motor 522 rotates the stage 502 relative to the camera 512. In some examples, the stage and diamond may remain stationary and the camera may rotate (not pictured).

Figure 6:
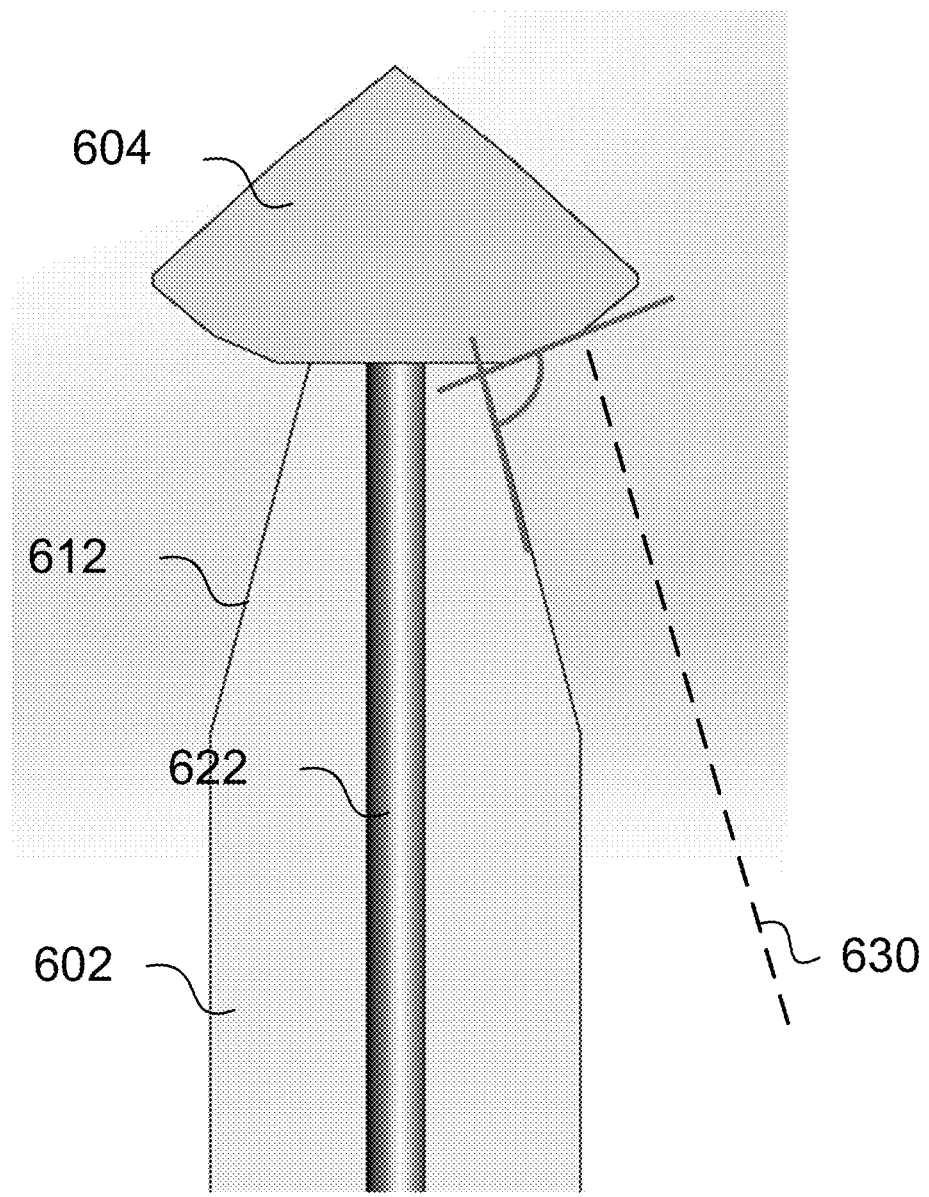
FIG. 6 is another illustration of an example stage in accordance with certain aspects described herein.

FIG. 6 shows an example stage detail which may be used in any of the hardware examples described herein, but especially in a FIG. 5 style arrangement to capture the crown facets of a sample gemstone. In the example, the stage 602 is shown holding or supporting the sample gemstone 604. The top of the stage 602 is shown with a tapered portion 612 to allow a clear visual path 630 for the camera (not shown in FIGS. 6 and 512 in FIG. 5) to capture images of the gemstone 604 crown facets. In some examples, a vacuum tube 622 may connect to a vacuum pump (not pictured) that lowers air pressure in the tube 622 and thereby supports the gemstone 604 on the top of the stage 612 by suction force, even in examples where a motor (not pictured) rotates the stage 602 for image capture. The arrangement of FIG. 6 could be used on any of the examples described herein.

In some examples, the upward camera arrangement of FIG. 5 and corresponding stage of FIG. 6 may be used in the other described setups of FIG. 1 and FIG. 2 or any other hardware arrangements described herein. Any combination or permutation of these hardware arrangements may be used to position the camera, stage, and/or lighting or any other hardware as described herein.

In some examples, it may be advantageous to align the camera light of sight with a light source. By so doing, the camera image may receive direct lighting from the same direction as the camera capturing the images. But arranging both a light and camera lens on top of one another may not be simple. Instead, FIG. 7 shows two options of how such an alignment of light and camera can be made.

Figure 7:
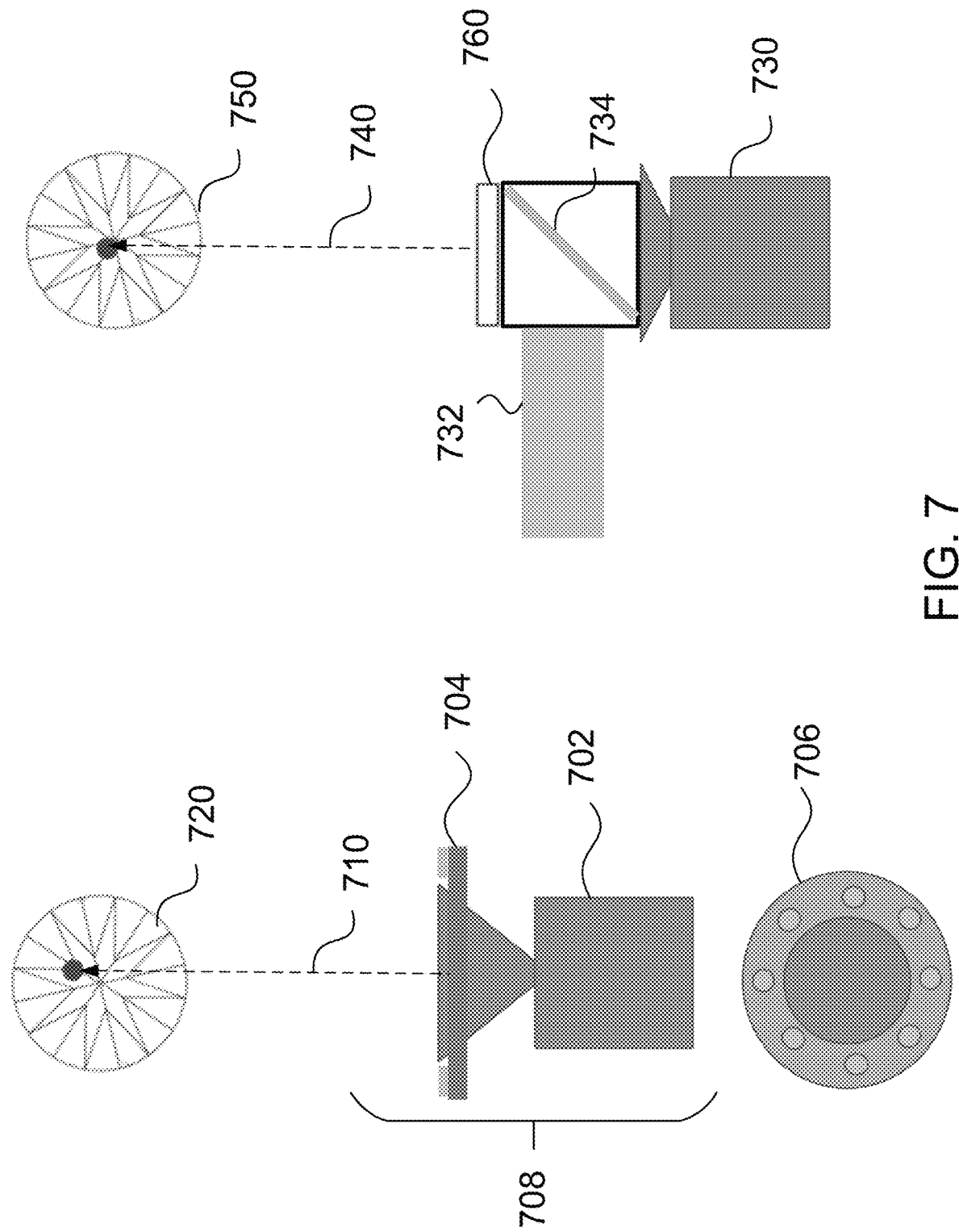
FIG. 7 is another illustration of an example system in accordance with certain aspects described herein.

FIG. 7 shows a first example system that may be used to capture images as described herein using structured illumination from a light ring. In example FIG. 7, the camera 702 is shown with a ring light 704 surrounding the lens. The ring light example is also shown in detail 706 to show how any number of light sources such as bulbs, LEDs, or any other kind of light emitting device may be used to encircle the camera 702 lens. In such a way, the camera arrangement 708 with its field of view and line of sight 710 is aimed in the same direction as the light from the ring light source 704. As described, the camera and light system 708 may be used to capture images of a gemstone or diamond 720.

FIG. 7 also shows another example of using on-axis diffused light with a camera 730 and its line of sight 740 to a target gemstone 750 may be made with a light 732. In the second FIG. 7 example, the light source 732 which may be any kind of light source such as but not limited to an LED or light bulb, may be aimed at a beam splitter 734 (e.g., a 50/50 reflection/transmission beam splitter, 40/60 reflection/transmission beam splitter, 10/90 reflection/transmission beam splitter). Such an arrangement may be configured to reflect the light from the light source 732 along a line of sight 740 and toward a target gemstone 750. In such an example, the camera and lens 730 may be aligned to aim through the beam splitter 734 that is configured to allow light reflected off the target gemstone 750 back to the camera 730 along the same line of sight 740. In such a way, the beam splitter 734 allows for the light illumination to be aimed in the same direction as the camera 730 is pointing and thereby illuminate the target. In some examples, the beam splitter 734 is a 90/10 beam splitter. In some examples, a polarizer 760 may be used in front of the beam splitter 734 to diffuse the light from the light source 732 and aid in image capture.

In some examples, a digital microscope camera such as but not limited to a Keyence microscope may be used to capture images of such surface reflectance alone or in combination with the other systems and methods described herein. Such a microscope may be used in place of the camera arrangements of FIG. 7, FIG. 1 and/or FIG. 2 or any other hardware setup described herein.

Example Images and Mapping

Figure 8A:
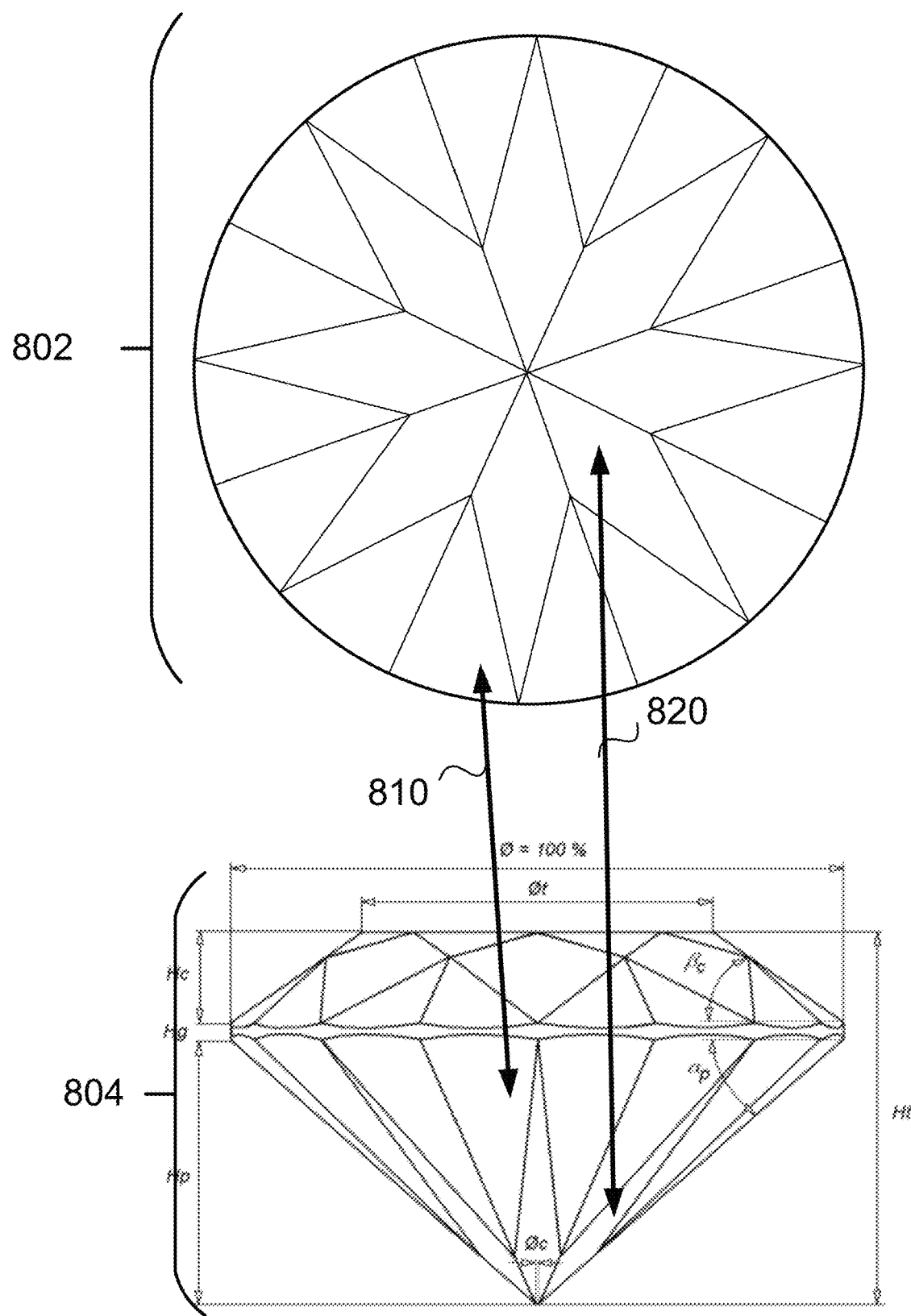
FIGS. 8A and 8B are illustrations of example mapping in accordance with certain aspects described herein.

FIG. 8A shows a top down view 802 of the culet of a sample gemstone as a map as well as a side on view 804 of the gemstone, table side up. An arrow 810 shows the correlation between one example facet on the two diagrams. The systems and methods described herein may be used to capture images of the gemstone facets including but not limited to 16 lower girdle facets (of which 810 is an example) at approximately 49 degrees. Similarly, the eight pavilion main facets (of which 820 is an example) may be imaged at approximately 48 degrees.

Figure 8B:
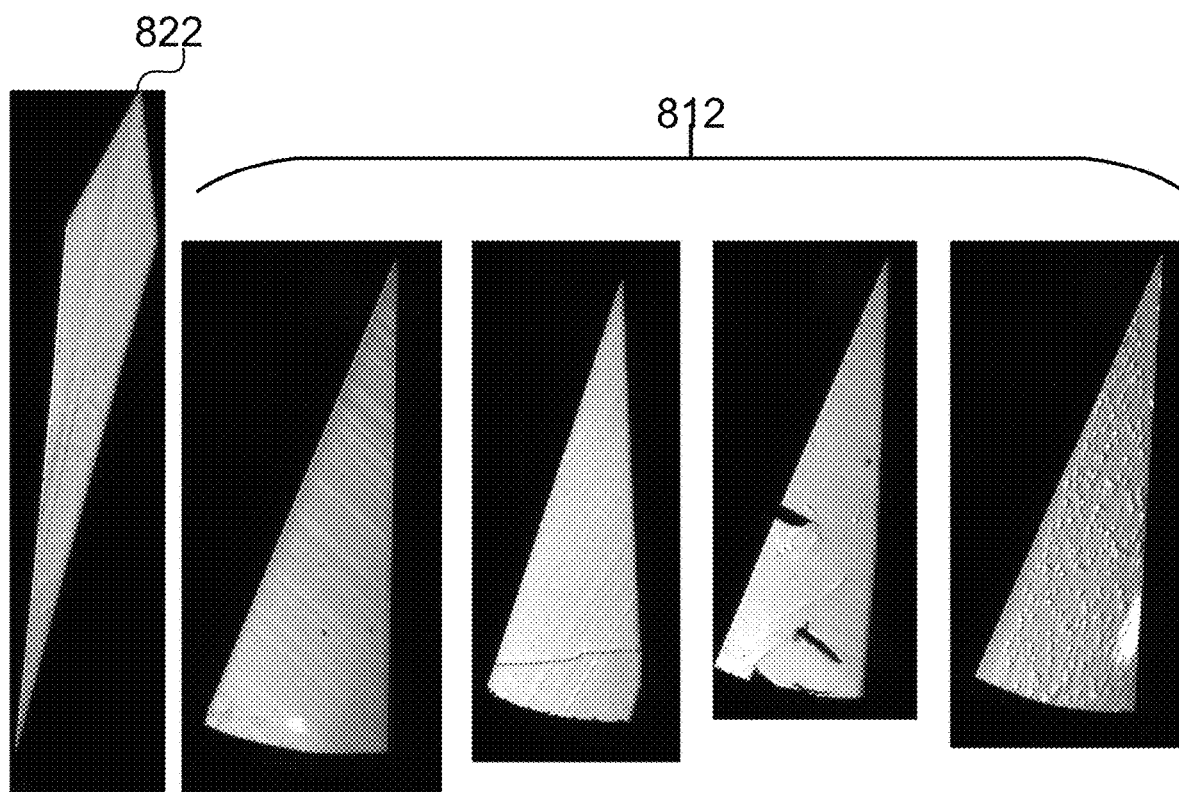

FIG. 8B shows example reflectance images of lower girdle facets 812 and one pavilion main facet 822. The detailed images of FIG. 8B shows the various polish lines, cracks, scratches, bumps, and other minute imperfections on various facets that may be imaged using the systems and methods here.

Figure 9:
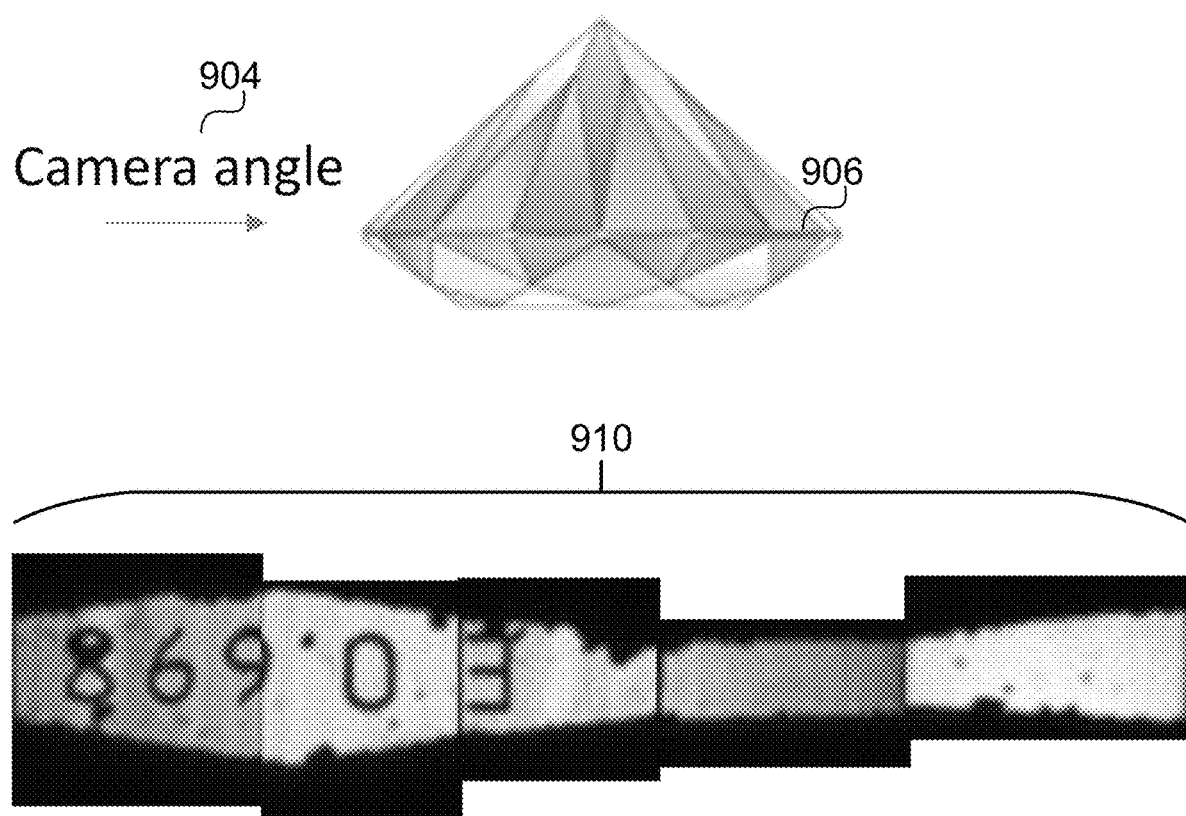
FIG. 9 is another illustration of example mapping in accordance with certain aspects described herein.

FIG. 9 shows an example of the camera angle 904 aimed directly at the girdle of the gemstone 906. The detail 910 shows examples of reflectance images of the girdle showing inscriptions and various minute imperfections.

Figure 10:
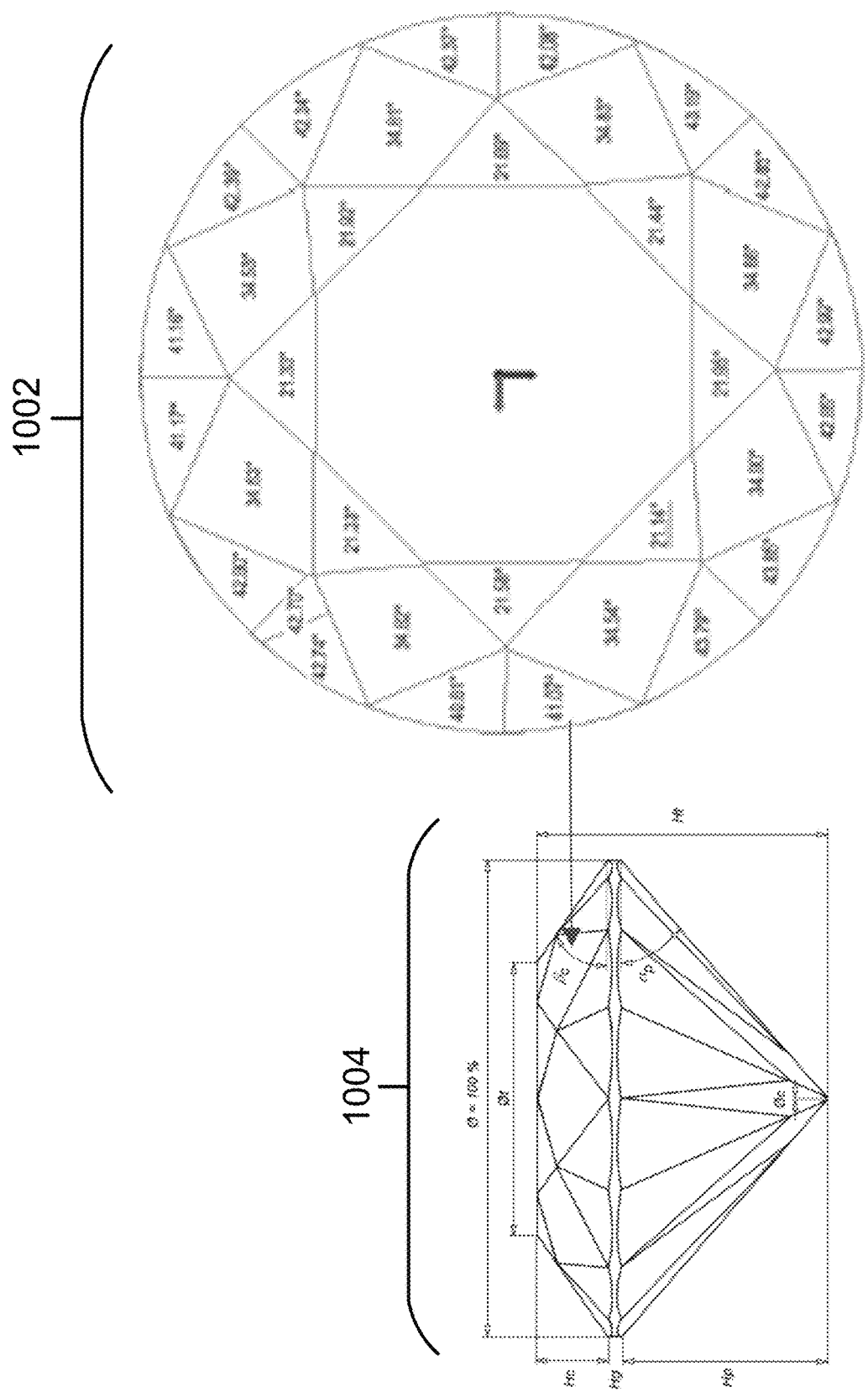
FIG. 10 is another illustration of example mapping in accordance with certain aspects described herein.

FIG. 10 shows an example of the crown 1002 of a gemstone and all of its facets correlated to the side image 1004 of the gemstone table side up with an arrow 1010 showing one correlated facet.

The systems and methods here may be used to determine where each of the identified features appears on the facets and the computer may correlate those features to the wireframe map of the stone. In such a way, by mapping the position of each identified feature, and identifying what kind of feature each is, a grade may be determined for the clarity and/or polish of the gemstone.

Figure 12:
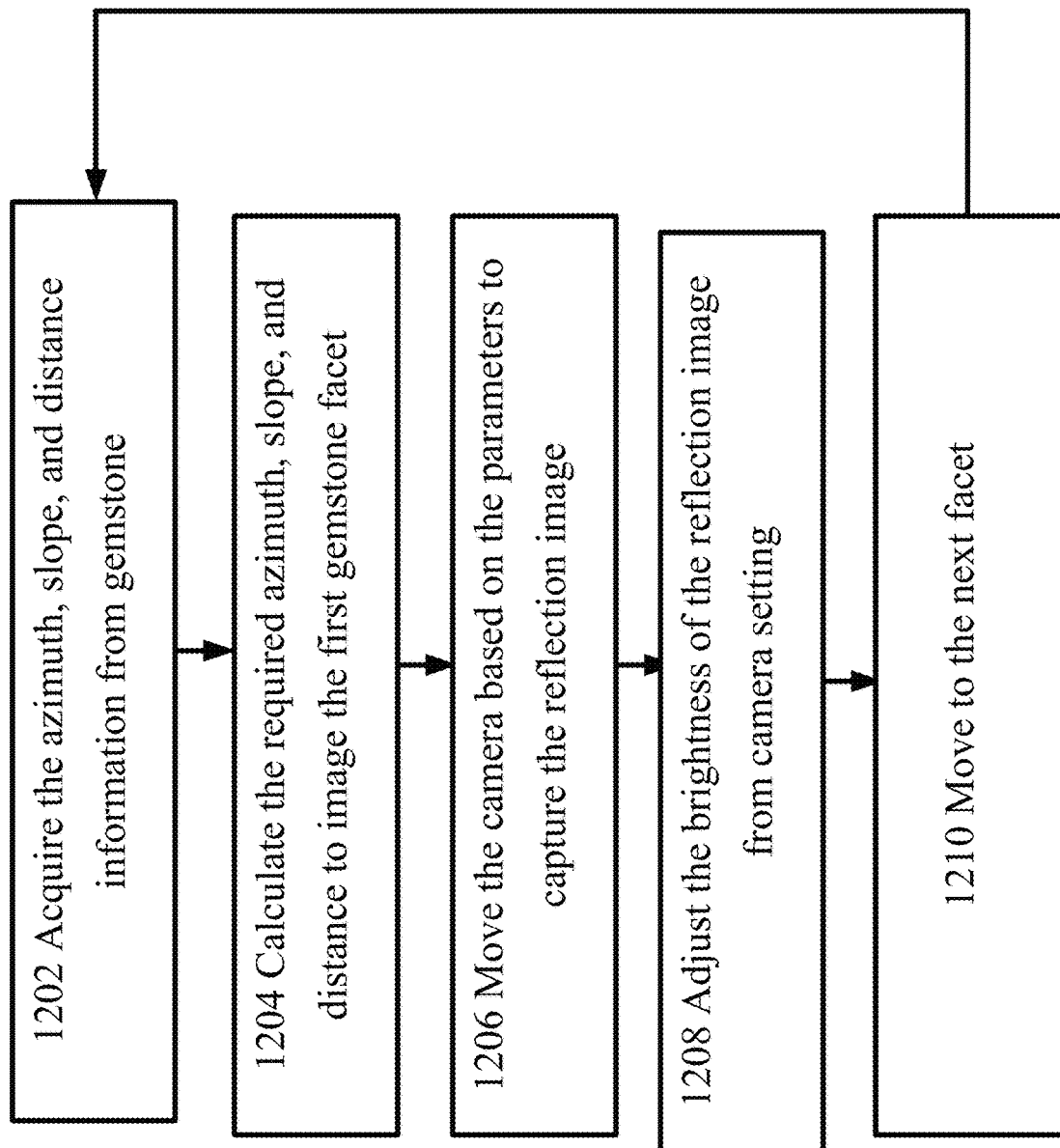
FIG. 12 is an example flow diagram of steps for image capture in accordance with certain aspects described herein.

FIG. 12 shows example steps using the systems and methods here to acquire multiple facet reflectance images. First, 1202 Acquire the azimuth, slope, and distance information from gemstone. Next, 1204 Calculate the required azimuth, slope, and distance to image the first gemstone facet. Next, 1206 Move the camera based on the parameters to capture the reflection image 1208. Then, adjust the brightness of the reflection image from camera setting, and then 1210 Move to the next facet which returns the flow chart back to 1202 to begin again on the next facet. Using this iterative process, all facets of the gemstone may be imaged and then analyzed.

Analysis of Images and Grading

The systems and methods described herein may be used as described to capture images of facets of gemstones, in a particular way to capture a reflectance of light off the surface of the facets, in order to analyze them and assign a grade based on the analysis. In some examples, that grade may be a clarity and/or surface polish grade. Either or both of these grades may be determined by using different detected features such as surface blemishes for surface polish grade and inclusions for clarity grade. Any combination of these may be used as well, for example, a surface blemish may also affect the clarity grade, etc. as known in the art.

The analysis of the images may include identifying features on each image which is possible because of the particular parameters that the reflectance images are taken. These special parameters allow the image to capture many more features than would otherwise be possible under different conditions including the depth of surface features.

Figure 11:
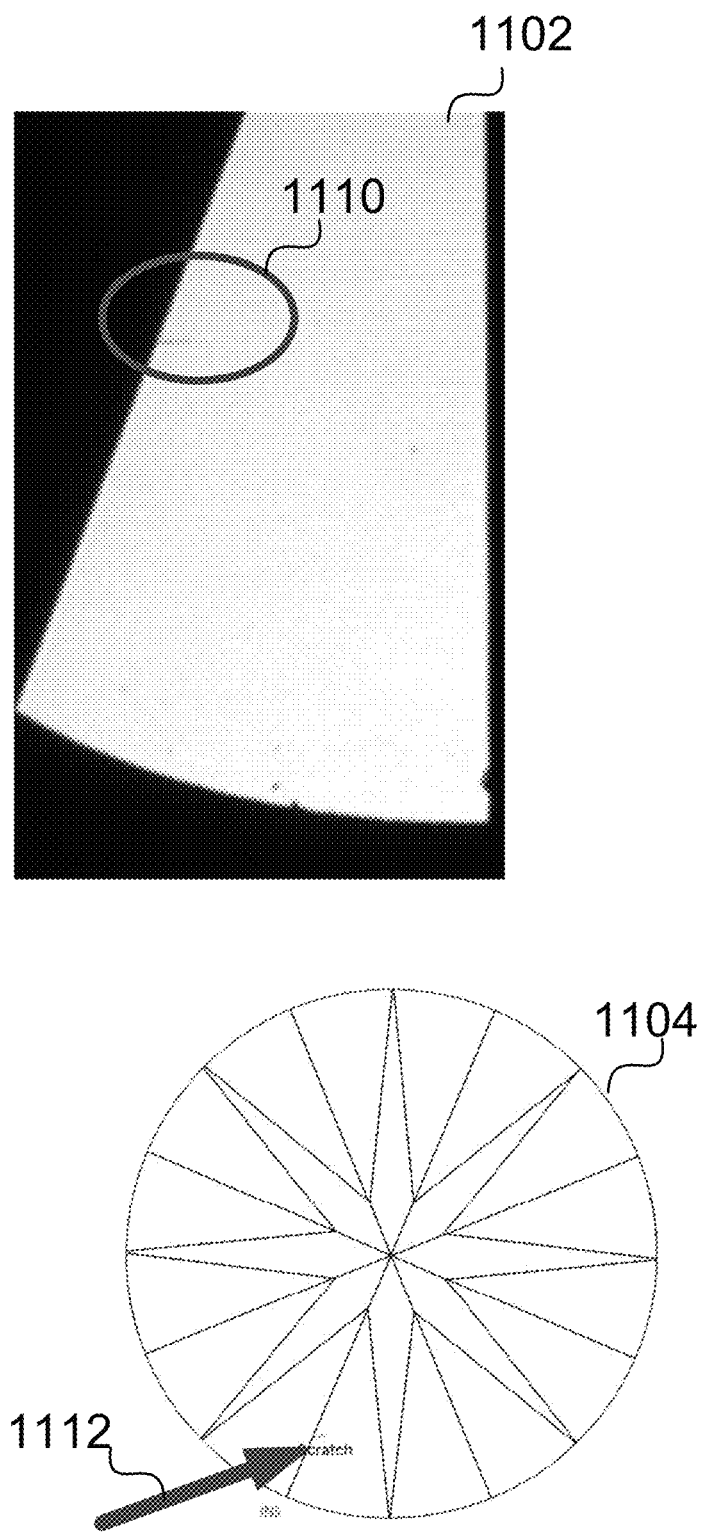
FIG. 11 is another illustration of example mapping in accordance with certain aspects described herein.

FIG. 11 shows an example of a single facet 1102 and a computer generated map 1104 of a gemstone. The computer analyzed the image of the facet 1102 and identifies a feature 1110. That feature may be any kind of blemish or inclusion as described herein. Such feature may be identified using comparison models and image analysis as described herein. Such feature 1110 may also be mapped 1112 to the wireframe model of the gemstone 1104 using the relative position of the feature 1110. In some examples, an obvious feature and/or laser inscription mark may be used by the computer as a reference point in mapping features. In such a way, each identified feature on a gemstone facet may be analyzed and/or mapped to a model, and then each facet may be analyzed for features to map and identify. In such a way, the entirety of a gemstone, and all its facets may be analyzed with each feature identified and/or mapped.

As explained, once identified, the features 1110 may be classified by the computer using image and pixel analysis. In some examples, the feature analysis may include comparison to known classified features. In some examples, AI may be used to differentiate and classify features. Examples of classifications of identified features may include but are not limited to inclusions, blemishes, filling surface reaching fractures with oil, epoxy, or a mixture of chemicals, and/or polishing lines. In some examples, surface features may be mapped on the facets upon which they appear. Such mapping may be done using the captured image and the computer system storing coordinates of an outline of the facet and coordinates of identified features within the outline of the facet.

In some examples, surface reaching inclusions may be a separate category. In some examples, a surface reaching inclusion may be further determined to be a sub category of any or all of the following or other sub category: feather, bearded girdle, bruise, knot, chip, cavity and/or indented natural. In some examples, these may include a depth of surface features, below or into a surface of the gemstone. In some examples, other features such as a blemish may be identified without depth. In some examples, other features may be identified such as, but not limited to, a nick, abrasion, scratch, extra facet, lizard skin, polish lines, burn marks, rough girdle, pit, dop burn, natural, scratch, polishing line, burn, and/or surface graining. Any or all of these features may be factored into the overall clarity grade, but in some examples, features such as polish blemishes may not affect the clarity grade. Thus, the computer system may determine the effect of each identified feature, depending on which classification is determined, size, shape, contrast, and/or position.

The computer may then utilize the identified features on each facet of a gemstone, classification of those identified features, size of each feature, and mapped locations of features if they exist, the number of features, relief, depth, the nature, and even color of features to assign a transparency or clarity grade to the overall gemstone. In some examples, features may be discounted or not considered in the overall grade of the clarity, if the feature is determined to be only attributed to polishing. In some examples, a separate polish grade may be determined and assigned in addition to or alternatively.

Figure 13:
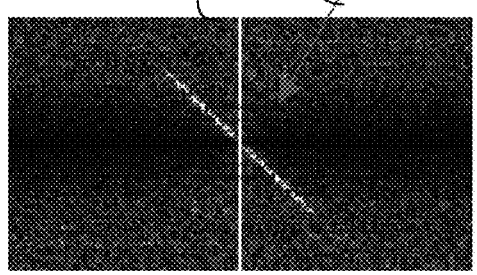
FIG. 13 is an example illustration showing polish line example mapping in accordance with certain aspects described herein.
Figure 13:
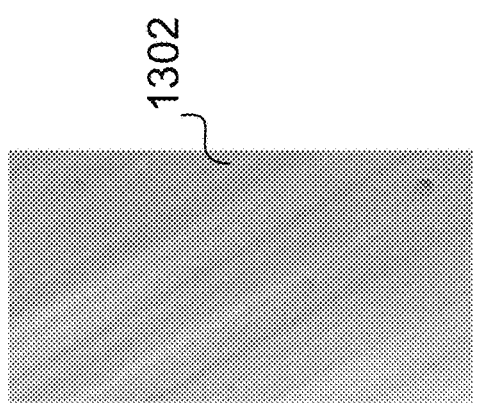

In some examples, a 2D Fourier transform may be used to distinguish a polish feature as opposed to another kind of gemstone blemish. In such examples, a polish line may create a line feature in frequency domain in 2D Fourier transform. FIG. 13 shows an example image 1302 along with a 2D Fourier Transform 1310 and a perpendicular line to the polish lines 1312.

Figure 14A:
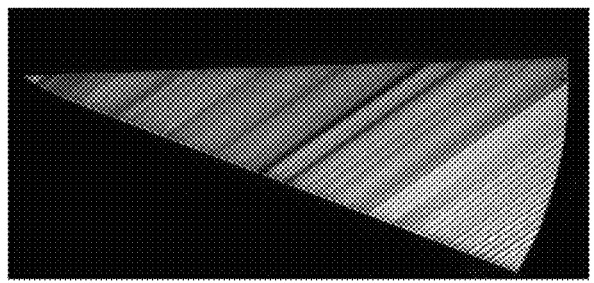
FIGS. 14A and 14B are example illustrations showing additional polish lines in accordance with certain aspects described herein.
Figure 14A:
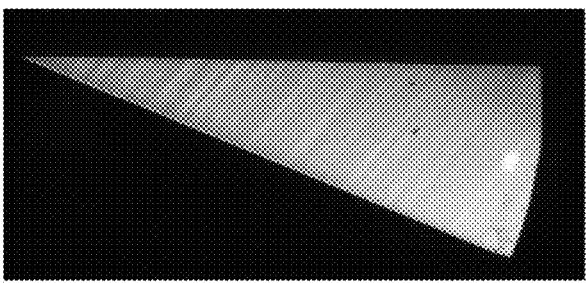
Figure 14A:
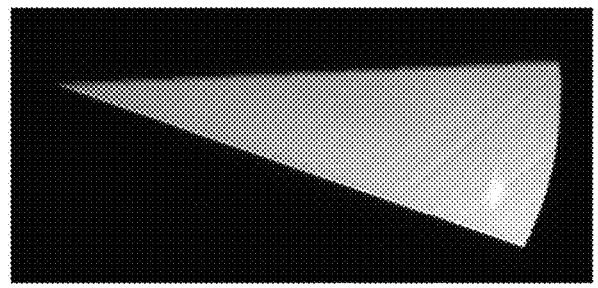
Figure 14A:
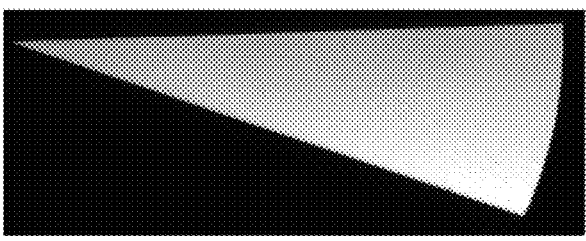

FIGS. 14A and B show another example of polish line analysis. In some examples, the computer may use a mean and median value from patch based root mean square (RMS) contrast analysis to evaluate polishing lines. In such examples, an image may be split into small patches, for example but not limited to 20 by 20 pixels. The computer may then calculate contrast for each patch and use the average and median value as output. Based on the determined contrast, the computer may classify the polishing lines into different grades.

Figure 14B:
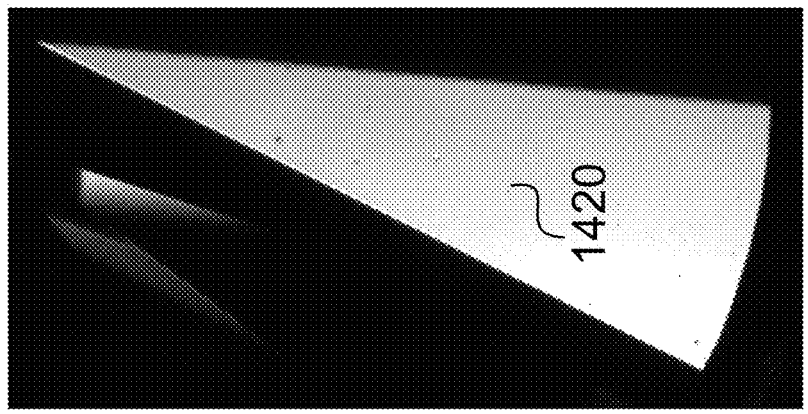
Figure 14B:
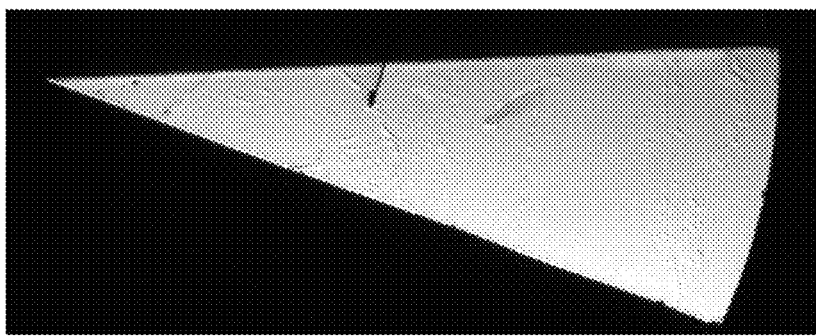
Figure 14B:
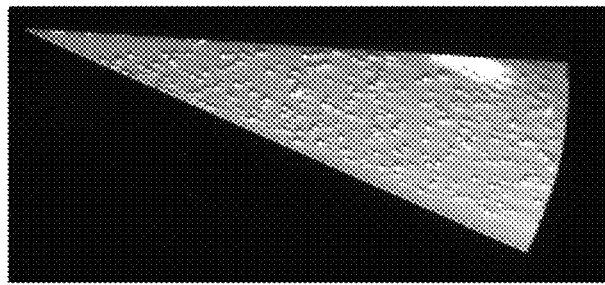

FIG. 14A shows different surface polish grade examples, high to low: Excellent (EX) 1402, very good (VG) 1404, good (GD) 1406, fair (FR) 1408, and poor (PR) (not shown). FIG. 14B shows more examples of polishing features that may be identified using a similar patch based RMS method such as but not limited to lizard skin 1410, surface graining 1412 and others 1414 with no surface polishing features but the dark spots 1420 shown are simply dust on the surface.

As described, if a feature is identified as a polish feature by a 2D Fourier or other method, that feature may be discounted when determining an overall clarity grade, depending on where and what kind of polish feature it is determined to be.

In some examples, machine learning, or artificial intelligence may be used to grade the gemstone clarity using the identified and/or mapped features. In such examples, many multiple training model data sets may be fed to the AI engine in order to train the computer to derive the optimal grade based on the location, size, and classification of identified features.

Multilighting Method Examples

Figure 15:
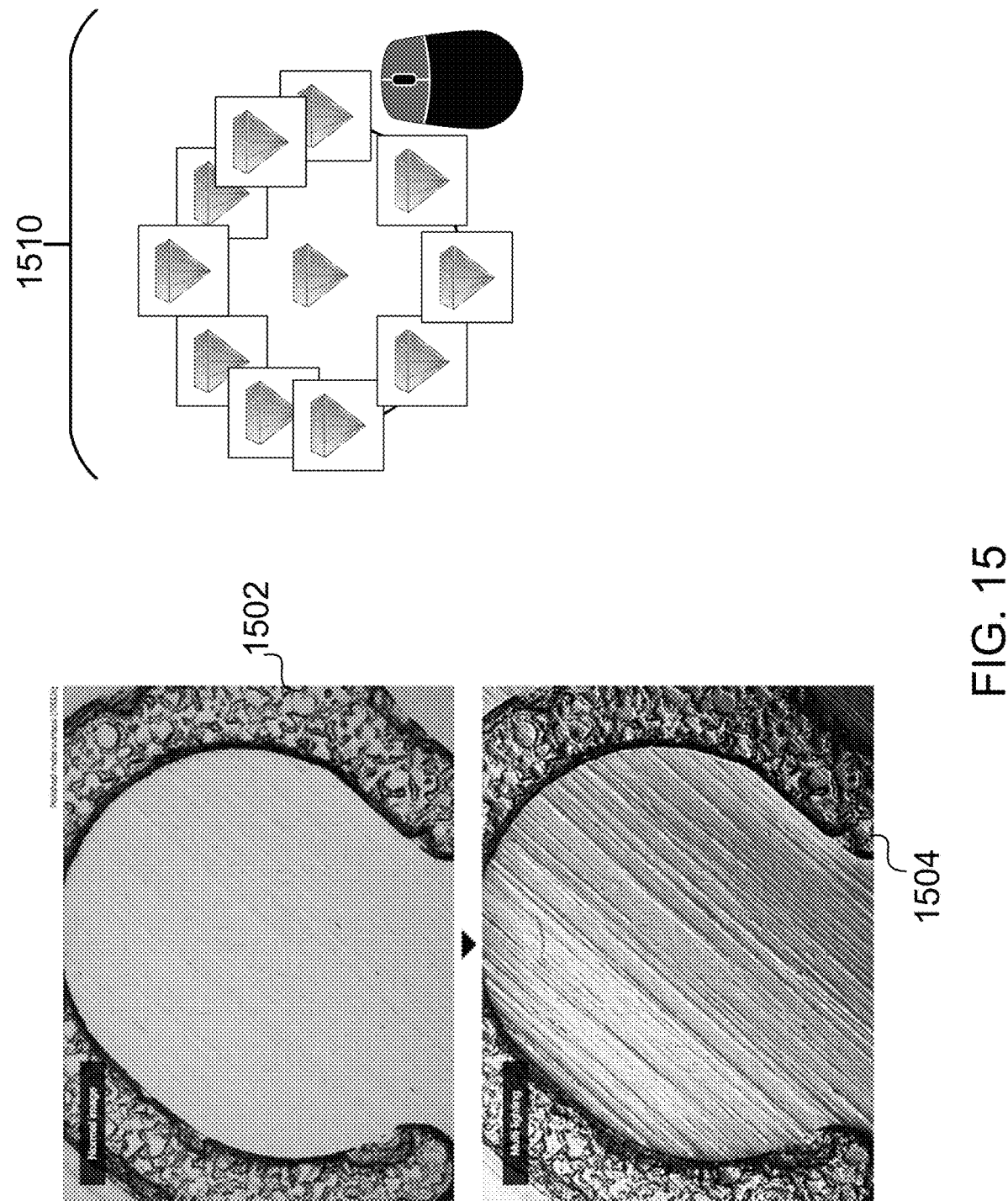
FIG. 15 is an example showing multiple angle examples and user interfaces for image capture in accordance with certain aspects described herein.

In some other examples, the surface reflectance systems and methods here may be used for structural illumination. In such examples, as shown in FIG. 15, a normal single source lighting image 1502 may not capture as many surface features as an image taken with multi lighting arrangement 1504 as such an arrangement may increase the contrast of any surface features that might be present in a facet. In some examples, the images are taken in succession using multiple lighting angles. In some examples, this is achieved with a ring light as explained in FIG. 7 and elsewhere and may include the successive turning on of some of the ring lights and turning some off in a coordinated manner to capture images as the ring light illuminates the target gemstone from different angles.

In such examples, omnidirectional lighting data may be used to capture multiple images automatically using computer software programs, from multiple reflectance directions and stored. The lighting data (incident angle but also any other options such as but not limited to temperature, brightness, distance, diffuser, polarization, filter, etc.) may be retained with each stored image and a user interface 1510 may allow the user to select from among many various images taken from multiple reflectance images. By moving an input such as mouse, track ball, touch screen interface, eye movement tracker, augmented reality gyroscope input, or any other kind of input device, a user may scroll among the various presented images 1510 taken under different lighting conditions and incident angles and view them all next to one another to select the image that best captures what the user is hoping to see. In some examples, this multi-lighting imaging may be used to average the result of multiple images using lights with different incident angles, not by selecting the most appropriate results.

In such a way, an image most suited for observation can be selected by a user or by a computer algorithm from among this data and multiple images. By presenting multiple options at the same time, this may eliminate the need to iteratively adjust light settings in order to obtain a clear image. Such lighting can be flexibly changed even after images are taken.

Networked System Examples

Figure 16:
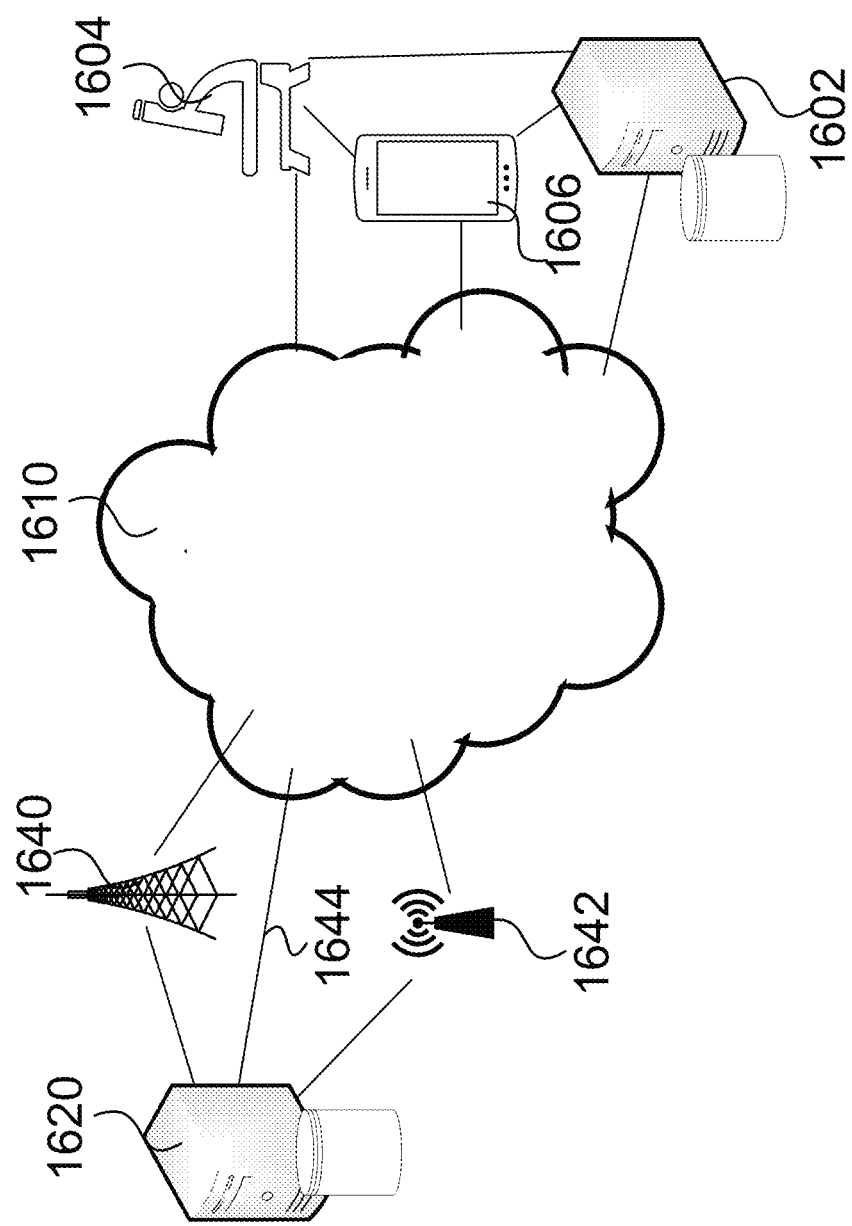
FIG. 16 is an illustration of an example networked system in accordance with certain aspects described herein.

In some examples, as shown in FIG. 16, a computer 1602 with processor and memory is configured to run software. The computer 1602 may be in communication with a network 1610 such as the Internet or local area network. Such computers may include any kind of computer such as but not limited to tablets, smartphones, desktops, laptops, or other computers 1606, and multiple computers may be in communication with one another or run the software as described herein. More detailed and/or further examples of such computers are found in FIG. 17. Other hardware components may include the device itself 1604 including but not limited to components described in FIG. 1 such as the reflectance measurement system.

Turning back to FIG. 16, the data captured from whichever computer 1602, 1606 may be analyzed on a back end system 1620 instead of or in addition to a local computer. In such examples, data may be transmitted to a back end computer 1620 and associated data storage for saving, analysis, computation, comparison, or other manipulation. In some examples, additionally or alternatively, the transmission of data may be wireless by a cellular 1640 or Wi-Fi 1642 transmission with associated routers and hubs. In some examples, additionally or alternatively, the transmission may be through a wired connection 1644. In some examples, additionally or alternatively, the transmission may be through a network such as the internet 1610 to the back end server computer 1620 and associated data storage. At the back end server computer 1620 and/or local computer systems 1602, 1604 and their respective associated data storage, the spectrometer data, sample identification, sample location, time, date, and/or any other associated test data may be stored, analyzed, compared to previously stored spectrometer data, identification, and/or any other kind of data analysis. In some examples, additionally or alternatively, the data storing, analyzing, and/or processing may be shared between the local computer 1602, 1604 and a back end computing system 1620. In such examples, networked computer resources may allow for more data processing power to be utilized than may be otherwise available at the local computers. In such a way, the processing and/or storage of data may be offloaded to the compute resources that are available. In some examples, additionally or alternatively, the networked computer resources 1620 may be virtual machines in a cloud or distributed infrastructure. In some examples, additionally or alternatively, the networked computer resources 1620 may be spread across many multiple physical or virtual computer resources by a cloud infrastructure. The example of a single computer server 1620 is not intended to be limiting and is only one example of a compute resource that may be utilized by the systems and methods described herein. In some examples, additionally or alternatively, artificial intelligence and/or machine learning may be used to analyze the spectrometer data from the samples. Such systems may employ data sets to train algorithms to help produce better and better results of analysis of samples.

Because the computer systems 1602, 1606 are in communication with the systems 1604, the software running on the computer(s) 1606, 1602 may be used for any number of things including but not limited to, power on the system, open and close the shutter on the is device 1604, continuous spectra collection, calibration for both light and dark, collect spectra, stop collection and save.

In some examples, since the same type of facets have similar azimuth and distance, the system may be used to measure all the same facet types by rotating the azimuth angles to complete the automatic facet images collections. In such examples, using round brilliant diamond as an example, the system may collect 16 lower girdles first, then move on to 8 pavilion mains, and then girdles, 16 upper girdles, 8 bazels and finally 8 stars. These are merely examples, and any kind of progressive image capture may be used as described.

Example Computer Devices

Figure 17:
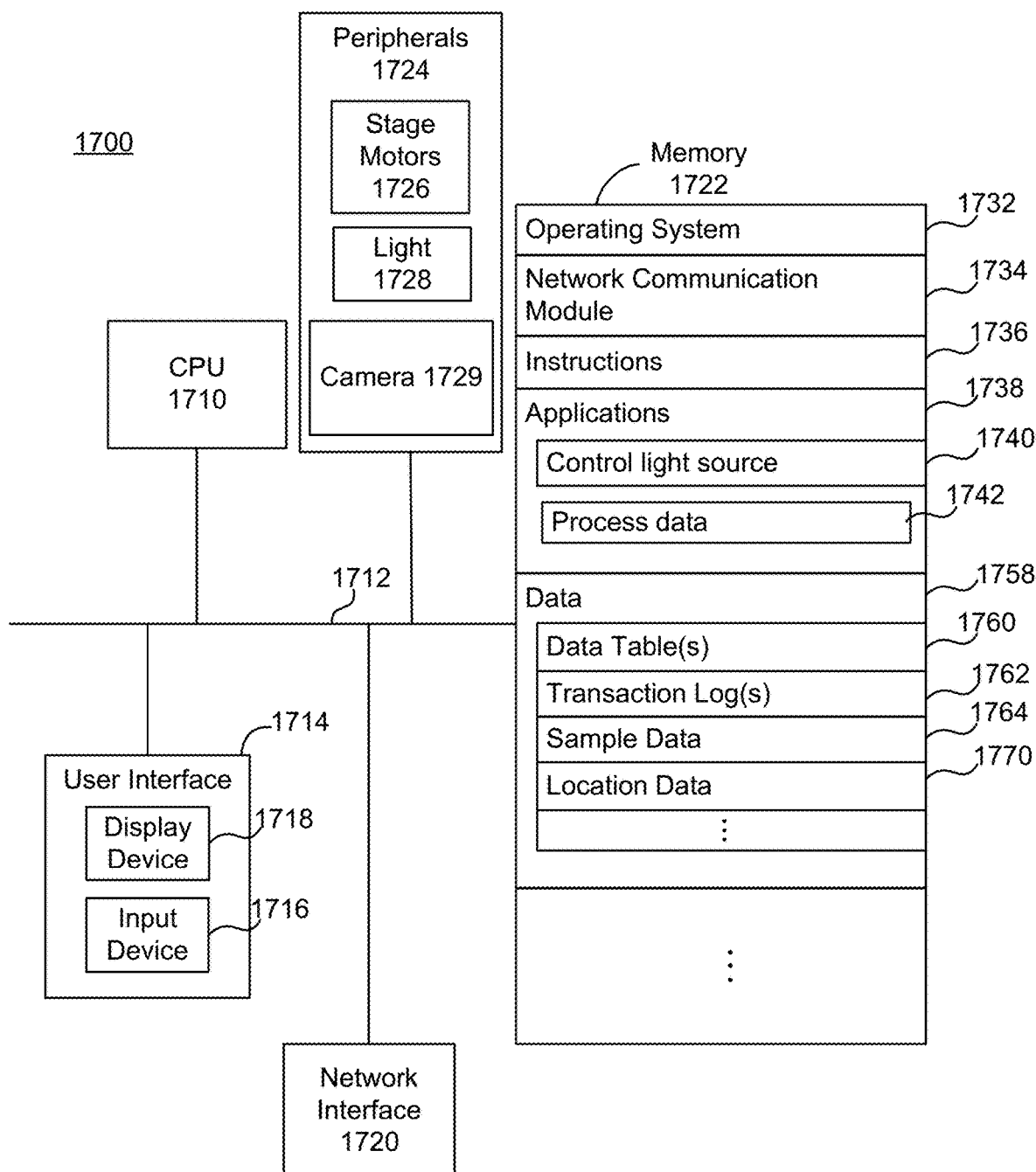
FIG. 17 is an illustration of an example computer system in accordance with certain aspects described herein.

FIG. 17 shows an example computing device 1700 which may be used in the systems and methods described herein. In the example computer 1700 a CPU or processor 1710 is in communication by a bus or other communication 1712 with a user interface 1714. The user interface includes an example input device such as a keyboard, mouse, touchscreen, button, joystick, or other user input device(s). The user interface 1714 also includes a display device 1718 such as a screen. The computing device 1700 shown in FIG. 17 also includes a network interface 1720 which is in communication with the CPU 1720 and other components. The network interface 1720 may allow the computing device 1700 to communicate with other computers, databases, networks, user devices, or any other computing capable devices. In some examples, additionally or alternatively, the method of communication may be through WIFI, cellular, Bluetooth Low Energy, wired communication, or any other kind of communication. In some examples, additionally or alternatively, the example computing device 1700 includes peripherals 1724 also in communication with the processor 1710. In some examples, additionally or alternatively, peripherals include stage motors 1726 such as electric servo and/or stepper motors used for turning the stage. In some examples peripherals 1724 may include light source 1728, and/or camera 1729. In some example computing device 1700 a memory 1722 is in communication with the processor 1710. In some examples, additionally or alternatively, this memory 1722 may include instructions to execute software such as an operating system 1732, network communications module 1734, other instructions 1736, applications 1738, applications to control camera and/or light source 1740, applications to process data 1742, data storage 1758, data such as data tables 1760, transaction logs 1762, sample data 1764, sample location data 1770 or any other kind of data.

CONCLUSION

As disclosed herein, features consistent with the present embodiments may be implemented via computer-hardware, software and/or firmware. For example, the systems and methods disclosed herein may be embodied in various forms including, for example, a data processor, such as a computer that also includes a database, digital electronic circuitry, firmware, software, computer networks, servers, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the embodiments or they may include a computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various machines may be used with programs written in accordance with teachings of the embodiments, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as 6PROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., H3P, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the descriptions have been specifically described herein, it will be apparent to those skilled in the art to which the descriptions pertains that variations and modifications of the various implementations shown and described herein may be made without departing from the spirit and scope of the embodiments. Accordingly, it is intended that the embodiments be limited only to the extent required by the applicable rules of law.

The present embodiments can be embodied in the form of methods and apparatus for practicing those methods. The present embodiments can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the embodiments. The present embodiments can also be in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the embodiments. When implemented on a processor, the program code segments combine with the processor to provide a unique device that operates analogously to specific logic circuits.

The software is stored in a machine readable medium that may take many forms, including but not limited to, a tangible storage medium, a carrier wave medium or physical transmission medium. Non-volatile storage media include, for example, optical or magnetic disks, such as any of the storage devices in any computer(s) or the like. Volatile storage media include dynamic memory, such as main memory of such a computer platform. Tangible transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: disks (e.g., hard, floppy, flexible) or any other magnetic medium, a CD-ROM, DVD or DVD-ROM, any other optical medium, any other physical storage medium, a RAM, a PROM and EPROM, a FLASH-EPROM, any other memory chip, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

The foregoing description, for purpose of explanation, has been described with reference to specific embodiments. However, the illustrative discussions above are not intended to be exhaustive or to limit the embodiments to the precise forms disclosed. Many modifications and variations are possible in view of the above teachings. The embodiments were chosen and described in order to best explain the principles of the embodiments and its practical applications, to thereby enable others skilled in the art to best utilize the various embodiments with various modifications as are suited to the particular use contemplated.

What is claimed is:

1. A system for analyzing a gemstone using reflectance analysis, the system comprising:
   a computer with a processor and memory in communication with a camera, a plurality of motors, and a light source,
   the computer configured to cause the light source to illuminate a gemstone mounted on a rotatable stage;
   the computer further configured to command the plurality of motors to adjust the camera such that a long focal axis of the camera is aligned with a normal of a target facet of the gemstone;
   the camera configured to capture an image of the gemstone target facet using the camera and send the captured image to the computer;
   the computer further configured to cause storage of the captured image and a correlated data set of information from the plurality of motors indicating an azimuth of the stage, slope angle of the camera to a horizontal, and distance of the camera to the gemstone;
   the computer further configured to receive a first image of the target facet of the gemstone from the camera, detect a feature in the captured image of the target facet of the gemstone, map the feature in the captured image of the target facet of the gemstone, identify the feature in the captured image of the facet of the gemstone, and
   determine a clarity grade or surface polish grade of the gemstone using all mapped and identified features on all facets of the gemstone.

2. The system of claim 1 wherein the determination of the azimuth of the stage, a slope angle of the camera to a horizontal, and a distance of the camera to the gemstone includes using wireframe information from the plurality of motors sent to the computer.

3. The system of claim 1 wherein one of the plurality of motors is a motor configured to turn the stage on which the gemstone sits.

4. The system of claim 1 wherein one of the plurality of motors is a motor configured to tilt the camera relative to the stage on which the gemstone sits.

5. The system of claim 1 wherein the light source and the camera are mounted to aim their respective focuses on the stage at an angle of between 10 and 30 degrees.

6. The system of claim 1 wherein one of the plurality of motors is a motor configured to increase and decrease the distance between the camera and the stage on which the gemstone sits to focus the camera.

7. The system of claim 1 wherein the computer is further configured to determine a surface polish grade of the gemstone using all mapped and identified features on all facets of the gemstone.

8. The system of claim 3 wherein the computer is configured to command the camera to focus and capture an image of the target facet, determine a position of a second facet, command the stage to rotate to bring the second facet into a field of view of the camera to capture a new image of the second facet.

9. The system of claim 1 wherein the feature to be identified and used in the clarity grade include at least one of a blemish, an inclusion, and a polish line.

10. A method for analyzing a gemstone using reflectance analysis, the method comprising:
by a computer with a processor and memory, in communication with a camera, a plurality of motors, and a light source,
causing the light source to illuminate a gemstone mounted on a rotatable stage;
commanding, by the computer, the plurality of motors to adjust the camera such that a long focal axis of the camera is aligned with a normal of a target facet of the gemstone;
capturing an image of the gemstone target facet using the camera;
causing storage, by the computer, of the captured image and a correlated data set of information from the plurality of motors indicating an azimuth of the stage, slope angle of the camera to a horizontal, and distance of the camera to the gemstone;
receiving, by the computer, a first image of the target facet of the gemstone from the camera;
detecting, by the computer, a feature in the captured image of the target facet of the gemstone;
mapping, by the computer, the feature in the captured image of the target facet of the gemstone;
identifying, by the computer, the feature in the captured image of the target facet of the gemstone; and
determining a clarity grade or surface polish grade of the gemstone using the mapped and identified feature on the target facet of the gemstone.

11. The method of claim 10 further comprising, generating a wireframe model of the gemstone by capturing a plurality of silhouette images of the gemstone by a silhouette camera and a back light source, wherein each of the plurality of silhouetted images is captured at a different rotation angle then the next, using the rotatable stage; and
using the wireframe model for mapping the feature in the captured image of the facet of the gemstone.

12. The method of claim 11 wherein the determining the azimuth of the stage, slope angle of the camera to a horizontal, and distance of the camera to the gemstone includes using the wireframe model.

13. The method of claim 10 wherein the determining the azimuth of the stage, slope angle of the camera to a horizontal, and distance of the camera to the gemstone includes using sensor data from the plurality of motors sent to the computer.

14. The method of claim 10 further comprising, receiving, by the computer, a second image of a second target facet of the gemstone from the camera;
detecting, by the computer, a second feature in the captured image of the second target facet of the gemstone;
mapping, by the computer, the second feature in the captured image of the second target facet of the gemstone;
identifying, by the computer, the second feature in the captured image of the second target facet of the gemstone; and
determining a clarity grade of the gemstone using the mapped and identified second feature on the second target facet of the gemstone.

15. The method of claim 10 wherein the identifying, by the computer, the feature is identifying at least one of a blemish, inclusion, oil fillings of surface reaching fractures, epoxy, chemicals and polishing line.

16. The method of claim 15 wherein the identifying, by the computer, the feature is identifying a surface inclusion.

17. The method of claim 15 wherein determining the clarity grade is conducted using machine learning analysis of the captured image.

18. A non-transitory computer readable media to command a computer process for executing a method for analyzing a gemstone using reflectance analysis, the method comprising:
by a computer with a processor and memory, in communication with a camera mounted with at least one motor, a stage with at least one rotatable motor, and a light source,
causing the light source to illuminate a gemstone mounted on the rotatable stage;
commanding, by the computer, the camera motor to adjust the camera such that a long focal axis of the camera is aligned with a normal of a target facet of the gemstone on the rotatable stage;
capturing an image of the gemstone target facet using the camera;
causing storage, by the computer, of the captured image;
receiving, by the computer, an image of the target facet of the gemstone from the camera;
detecting, by the computer, a feature in the captured image of the target facet of the gemstone;
mapping, by the computer, the feature in the captured image of the target facet of the gemstone;
identifying, by the computer, the feature in the captured image of the target facet of the gemstone; and
determining a clarity grade or surface polish grade of the gemstone using the mapped and identified feature on the target facet of the gemstone.

19. The non-transitory computer readable media of claim 18 wherein the causing storage, by the computer, of the captured image includes storage of correlated data of information from the camera and stage motors indicating an azimuth of the stage, slope angle of the camera to a horizontal, and distance of the camera to the gemstone.

20. The non-transitory computer readable media of claim 18, the method further comprising, generating a wireframe model of the gemstone by capturing a plurality of silhouette images of the gemstone by a silhouette camera and a back light source, wherein each of the plurality of silhouetted images is captured at a different rotation angle then the next, using the rotatable stage; and
using the wireframe model for mapping the feature in the captured image of the facet of the gemstone.

* * * * *